(12) United States Patent
Okunishi et al.

(10) Patent No.: US 12,113,041 B2
(45) Date of Patent: Oct. 8, 2024

(54) SEMICONDUCTOR DEVICE WITH SENSE TERMINAL

(71) Applicant: RENESAS ELECTRONICS CORPORATION, Tokyo (JP)

(72) Inventors: Noriko Okunishi, Tokyo (JP); Toshiyuki Hata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 138 days.

(21) Appl. No.: 17/717,756

(22) Filed: Apr. 11, 2022

(65) Prior Publication Data

US 2022/0392865 A1 Dec. 8, 2022

(30) Foreign Application Priority Data

Jun. 2, 2021 (JP) .................................. 2021-093167

(51) Int. Cl.
*H01L 23/00* (2006.01)
*H01L 23/495* (2006.01)
*H01L 29/747* (2006.01)
*H01L 29/78* (2006.01)
*H02K 11/33* (2016.01)
*H02M 7/00* (2006.01)

(52) U.S. Cl.
CPC .............. *H01L 24/40* (2013.01); *H01L 24/37* (2013.01); *H01L 24/41* (2013.01); *H01L 24/45* (2013.01); *H01L 24/48* (2013.01); *H01L 23/49562* (2013.01); *H01L 29/747* (2013.01); *H01L 29/7813* (2013.01); *H01L 2224/37124* (2013.01); *H01L 2224/37147* (2013.01); *H01L 2224/4001* (2013.01); *H01L 2224/4007* (2013.01); *H01L 2224/40245* (2013.01); *H01L 2224/4103* (2013.01); *H01L 2224/45144* (2013.01); *H01L 2224/45147* (2013.01); *H01L 2224/48245* (2013.01); *H01L 2924/13018* (2013.01); *H01L 2924/13091* (2013.01); *H02K 11/33* (2016.01); *H02M 7/003* (2013.01)

(58) Field of Classification Search
CPC ....................................................... H01L 24/40
USPC ............................................................ 257/676
See application file for complete search history.

(56) References Cited

U.S. PATENT DOCUMENTS 7,667,307 B2 2/2010 Muto et al.
2009/0218676 A1 9/2009 Muto et al.
(Continued)

FOREIGN PATENT DOCUMENTS

JP 2008-294384 A 12/2008
JP 2009-200148 A 9/2009
(Continued)

OTHER PUBLICATIONS

Extended European Search Report issued in corresponding European Patent Application No. 22176266.9-1211, dated Dec. 23, 2022.
(Continued)

*Primary Examiner* — Ajay Arora
(74) *Attorney, Agent, or Firm* — Rimon P.C.

(57) ABSTRACT

In order to reduce on-resistance in a semiconductor device to be used for high current applications, the semiconductor device includes a source terminal lead located between a gate terminal lead and a Kelvin terminal lead in plan view and electrically connected with a source terminal via a plurality of wires.

20 Claims, 23 Drawing Sheets

(56) References Cited

U.S. PATENT DOCUMENTS

| | | | |
|---|---|---|---|
| 2012/0280252 A1 | 11/2012 | Ryu et al. | |
| 2017/0089957 A1 | 3/2017 | Takada et al. | |
| 2018/0102308 A1* | 4/2018 | Nishiwaki | H01L 23/49513 |
| 2020/0126962 A1 | 4/2020 | Kono | |
| 2022/0320049 A1* | 10/2022 | Onodera | H01L 23/053 |

FOREIGN PATENT DOCUMENTS

| | | |
|---|---|---|
| JP | 2009-231805 A | 10/2009 |
| JP | 2014-517513 A | 7/2014 |
| JP | 2017-069412 A | 4/2017 |
| JP | 2018-063993 A | 4/2018 |
| JP | 2019-029997 A | 2/2019 |

OTHER PUBLICATIONS

Office Action received in corresponding Japanese Patent Application No. 2021-093167, dated Aug. 6, 2024, w/ English Translation.

* cited by examiner

SEMICONDUCTOR DEVICE WITH SENSE TERMINAL

CROSS-REFERENCE TO RELATED APPLICATIONS

The disclosure of Japanese Patent Application No. 2021-093167 filed on Jun. 2, 2021 including the specification, drawings and abstract is incorporated herein by reference in its entirety.

BACKGROUND

The present invention relates to a semiconductor device and, for example, to a technique that is applicable to a semiconductor device as a component of an inverter.

Here, there are disclosed techniques listed below.
[Patent Document 1] Japanese Unexamined Patent Application Publication No. 2008-294384
[Patent Document 2] Japanese Unexamined Patent Application Publication No. 2009-231805

Patent Document 1 discloses a technique for reducing the on-resistance of a semiconductor device in which a power MOSFET (Metal Oxide Semiconductor Field Effect Transistor) is formed.

Patent Document 2 also discloses a technique for reducing the on-resistance of a semiconductor device in which a power MOSFET is formed.

SUMMARY

In recent years, it has been considered to flow a large current to a semiconductor device in which a power semiconductor element is formed. For example, it is considered to flow a current of about 300 A (i.e. 300 ampere) to a semiconductor device to be used in 3-phase inverters. In this regard, when a large current is flowed to the semiconductor device, the on-resistance present in the semiconductor device has a significant effect on the performance of the semiconductor device. Therefore, in the semiconductor device to be used in an application where a large current flows, it is desired to reduce the on-resistance.

A semiconductor device according to one embodiment, includes a force terminal lead located between a gate terminal lead and a sense terminal lead in plan view and electrically connected with a force terminal via a force terminal connecting member of a plurality of connecting members.

Also, a semiconductor device according to another embodiment, includes a force terminal lead located between a gate terminal lead and a multi-function terminal lead in plan view and electrically connected with a force terminal via a force terminal connecting member of a plurality of connecting members.

According to an embodiment, the performance of the semiconductor device can be improved.

DETAILED DESCRIPTION

Figure 1:
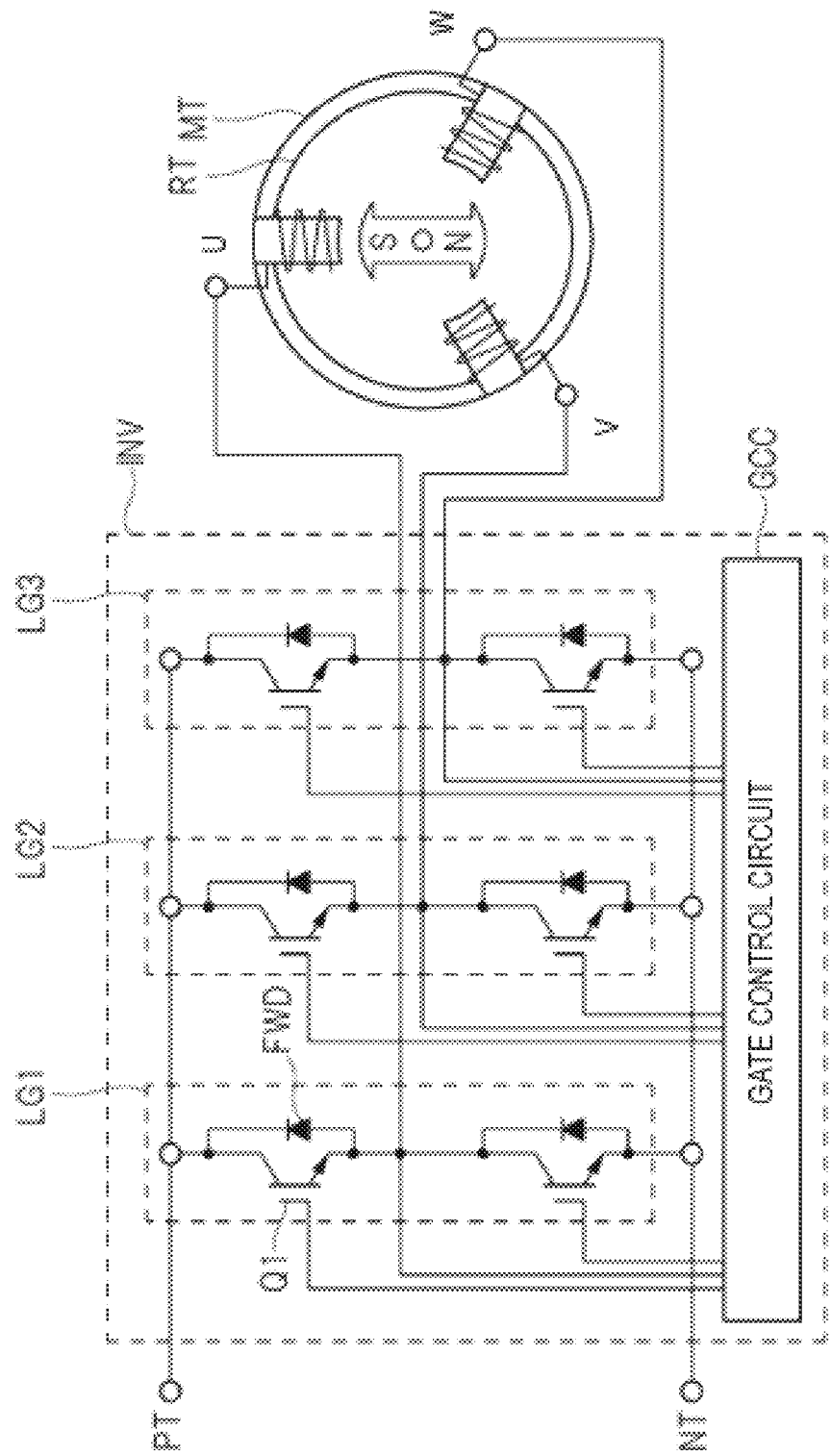
FIG. 1 is a circuit diagram showing a circuit configuration including an inverter circuit and a 3-phase induction motor.

In all the drawings for explaining the embodiments, the same members are denoted by the same reference numerals in principle, and repetitive descriptions thereof are omitted. Note that even plan view may be hatched for the sake of clarity.

Configuration Example of 3-Phase Inverter Circuit

A semiconductor device in the present embodiment, for example, is used in the driving circuit of a 3-phase induction motor used in an air conditioner or the like. Specifically, this drive circuit includes an inverter circuit, the inverter circuit is a circuit having a function of converting DC power to AC power.

FIG. 1 is a circuit diagram showing a circuit configuration including an inverter circuit and a 3-phase induction motor. In FIG. 1, the motor circuit includes a 3-phase induction motor MT and an inverter circuit INV. The 3-phase induction motor MT is configured to be driven by 3-phase voltages with different phases. Specifically, in the 3-phase induction motor MT, U-phase shifted by 120 degrees, V-phase, to generate a rotating magnetic field around the rotor RT is a conductor by utilizing a 3-phase AC called W-phase. In this case, the magnetic field will rotate around the rotor RT. This means that the magnetic flux across the rotor RT, which is a conductor, changes. As a result, electromagnetic induction occurs in the rotor RT, which is a conductor, and the induced current flows in the rotor RT. Then, the fact that the induced current flows in the rotating magnetic field means that the force is applied to the rotor RT by Fleming's left hand law, which causes the rotor RT to rotate. Thus, in the 3-phase induction motor MT, by utilizing a 3-phase AC, it can be seen that it is possible to rotate the rotor RT. That is, in the 3-phase induction motor MT, 3-phase AC is required. Therefore, in the motor circuit, 3-phase alternating current is supplied to the 3-phase induction motor by utilizing the inverter circuit INV which produces alternating current from direct current.

It will be described below a configuration example of the inverter circuit INV.

As shown in FIG. 1, for example, the inverter circuit INV, the switching element Q1 and the diode FWD corresponding to the 3-phases are provided. That is, in the inverter circuit INV, for example, a configuration in which anti-parallel connection of the switching element Q1 and the diode FWD as shown in FIG. 1, and realizes the components of the inverter circuit INV. For example, in FIG. 1, the upper arm and the lower arm of the first leg LG1, the upper arm and the lower arm of the second leg LG2, each of the upper arm and the lower arm of the third leg LG3, the switching elements Q1 and the diode FWD It will be composed of anti-parallel connected components.

In other words, in the inverter circuit INV, each phase of the positive potential terminal PT and the 3-phase induction motor MT (U-phase, V-phase, W-phase) and the switching element Q1 and the diode FWD is connected in anti-parallel, and also between each phase and the negative potential terminal NT of the 3-phase induction motor MT switching element Q1 and the diode FWD is connected in anti-parallel. That is, two switching elements Q1 and two diodes FWD are provided for each single phase, six switching elements Q1 and six diodes FWD in 3-phases are provided. Then, the gate electrode of the individual switching element Q1, the gate control circuit GCC is connected, by the gate control circuit GCC, so that the switching operation of the switching element Q1 is controlled. In the inverter circuit INV thus configured, by controlling the switching operation of the switching element Q1 in the gate control circuit GCC, by converting the DC power into 3-phase AC power, so as to supply the 3-phase AC power to the 3-phase induction motor MT.

<Type of Switching Element>

For example, as the switching element Q1 used in the inverter-circuit INV, power MOSFET and IGBT (Insulated Gate Bipolar Transistor) can be mentioned.

<Necessity of Diode>

As described above, the inverter circuit INV, although the switching element Q1 is used, as the switching element Q1, when using IGBT, it is required to provide a diode FWD connected anti-parallel to IGBT.

Simply, from the viewpoint of realizing the switching function by the switching element Q1, although IGBT as the switching element Q1 is required, it is considered that there is no need to provide a diode FWD. In this regard, for example, when the load is a motor, if the load connected to the inverter circuit INV contains inductance, it is necessary to provide a diode FWD. The reason for this will be described below.

The diode FWD is unnecessary because there is no energy to reflux when the load is a pure resistance that does not contain inductance. However, when a circuit including an inductance such as a motor is connected to the load, there is a mode in which the load current flows in the opposite direction to the switch being turned on. That is, if the load contains inductance, the energy may return from the inductance of the load to the inverter circuit INV (the current may flow backward).

At this time, IGBT itself does not have a function to allow this reflux current to flow, so it is required to connect the diode-FWD in anti-parallel with IGBT. That is, in the inverter circuit INV, when the load includes an inductance as in the case of motor control, when IGBT is turned off, the inverter circuit INV must always discharge the energy (½LI2) stored in the inductance. However, with IGBT alone, it is impossible to flow reflux current to release the energy stored in the inductance. Therefore, in order to reflux the electric energy stored in the inductance, connecting the diode FWD in anti-parallel with IGBT. In other words, the diode-FWD has a function of passing reflux current to open the electric energy stored in the inductance. From the above, in the inverter circuit connected to a load including an inductance, when employing a IGBT as the switching element Q1, it can be seen that there is a need to provide a diode FWD in anti-parallel with IGBT. This diode FWD is referred to as a freewheel diode.

In contrast, as the switching element Q1, when using the power MOSFET, in principle, there is no need to provide a freewheeling diode connected anti-parallel to the power MOSFET. This is because, in the device-structure of the power MOSFET, inevitably, the body diode, which is a pn-junction diode, is parasitically formed, resulting in this body diode functioning as a freewheeling diode.

However, as the switching element Q1, even when using a power MOSFET, sometimes used as a freewheel diode small Schottky diode forward voltage drop than the pn junction diode.

Technical philosophy in the present embodiment is applicable in a configuration using any of IGBT and the power MOSFET to the switching element Q1, in the following description, exemplified when constituting the switching element Q1 from the power MOSFET. Since the presence or absence of a freewheeling diode is not directly related to the explanation of the technical philosophy in the present embodiment, for simplicity, we will explain the technical philosophy in the present embodiment by assuming that there is no freewheeling diode.

Implementation Layout Example of Inverter Circuit

Figure 2:
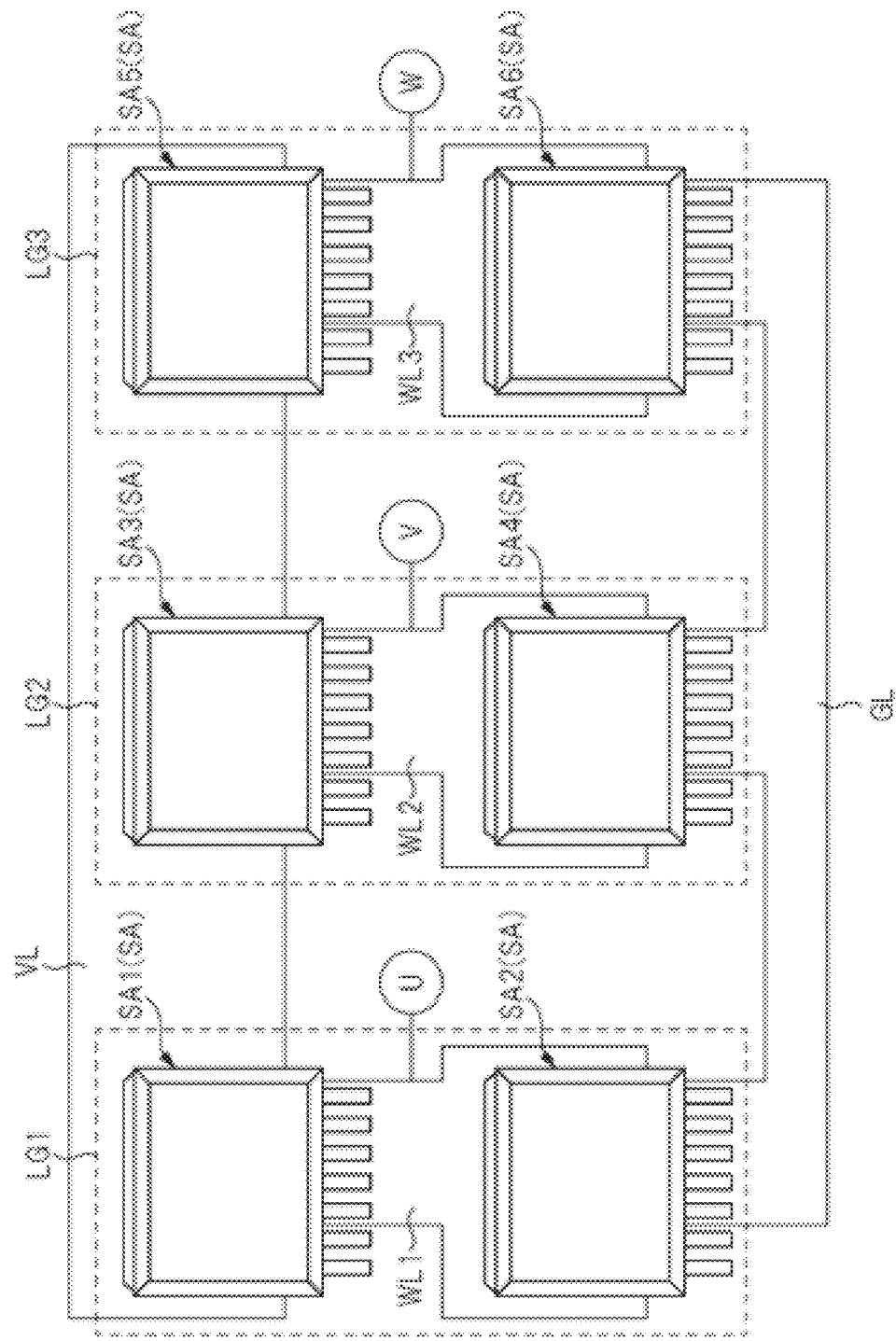
FIG. 2 is a schematic diagram showing an implementation layout example for realizing the inverter circuit.

FIG. 2 is a schematic diagram showing an implementation layout example for realizing the inverter circuit.

In FIG. 2, the motherboard, the power supply wiring VL and the wiring WL1—the wiring WL3 and the ground wiring GL are formed. The power supply wiring VL, while the power supply potential is supplied, the ground wiring GL, the ground potential is supplied. Further, the wiring WL1 is connected to the U-phase of the 3-phase induction motor, the wiring WL2 is connected to the V-phase of the 3-phase induction motor, the wiring WL3 is connected to the W-phase of the 3-phase induction motor.

As shown in FIG. 2, between the power supply wiring VL and the wiring WL1, while a semiconductor device SA1 is connected, between the wiring WL1 and the ground wiring GL, a semiconductor device SA2 is connected. That is, the semiconductor device SA1 and the semiconductor device SA2 are connected in series between the power supply line VL and the ground line GL, constitute a first leg LG1 of the inverter-circuit INV shown in FIG. That is, the semiconductor device SA1 constitutes an upper arm of the first leg LG1, while the semiconductor device SA2 constitutes a lower arm of the first leg LG1. Then, each of the semiconductor device SA1 and the semiconductor device SA2 has a semiconductor chip power MOSFET functioning as a switching element Q1 is formed.

Similarly, between the power supply wiring VL and the wiring WL2, while a semiconductor device SA3 is connected, between the wiring WL2 and the ground wiring GL, a semiconductor device SA4 is connected. That is, the semiconductor device SA3 and the semiconductor device SA4 are connected in series between the power supply line VL and the ground line GL constitute a second leg LG2 of the inverter circuit INV shown in FIG. That is, the semiconductor device SA3 constitutes an upper arm of the second leg LG2, and the semiconductor device SA4 constitutes a lower arm of the second leg LG2. Then, each of the semiconductor device SA3 and the semiconductor device SA4 has a semiconductor chip power MOSFET functioning as a switching element Q1 is formed.

Furthermore, between the power supply wiring VL and the wiring WL3, while a semiconductor device SA5 is connected, between the wiring WL3 and the ground wiring GL, a semiconductor device SA6 is connected. That is, the semiconductor device SA5 and the semiconductor device SA6 are connected in series between the power supply line VL and the ground line GL constitute a third g LG3 of the inverter circuit INV shown in FIG. That is, the semiconductor device SA5 constitutes the upper arm of the third leg LG3, and the semiconductor device SA6 constitutes the lower arm of the third leg LG3. Then, each of the semiconductor device SA5 and the semiconductor device SA6 has a semiconductor chip power MOSFET functioning as a switching element Q1 is formed.

As described above, by arranging the six semiconductor devices SA1 to SA6 on the motherboard in which the power supply wiring VL1, the wiring WL1 to the wiring WL3, and the ground wiring GL are formed as shown in FIG. 2, a mounting layout corresponding to the inverter circuit can be realized.

<Benefits of "to Package">

In the present embodiment, for example, as shown in FIG. 2, as a package structure of a semiconductor device SA having a semiconductor chip in which a power MOSFET is formed, "TO (Transistor Outline) package" is employed. Here, the "TO package" is defined as a package structure in which a plurality of leads is arranged only beside the first side of the semiconductor device in plan view. In this respect, the "TO package" is different from the "SON (Small Outline Non-Leaded) package" or the "SOP (Small Outline Package) package" in which a plurality of leads are arranged not only on the first side of the semiconductor device but also on the second side opposite the first side, and further different from the "QFN (Quad Flat Non-leaded) package" or the "QFP (Quad Flat Package) package" in which a plurality of leads are arranged on all four sides of the semiconductor device in plan view. According to the "TO package" employed in the present embodiment, for example, since a plurality of leads is arranged only beside the first side of the semiconductor device SA as shown in FIG. 2, the above-described other packages are advantageous in that it is easier to route the wires on the motherboard. That is, by adopting the "TO package", it is possible to realize a mounting layout corresponding to the inverter circuit with a simplified layout (see FIG. 2).

The present inventor has considered from the viewpoint of reducing the on-resistance of semiconductor device SA on the assumption that semiconductor device SA is constructed from the "TO package" having the advantages described above, in the "TO package", from the viewpoint of realizing to reduce the on-resistance, the following it is found that there is room for improvement. Therefore, this point will be described.

<Room for Improvement>

Figure 3:
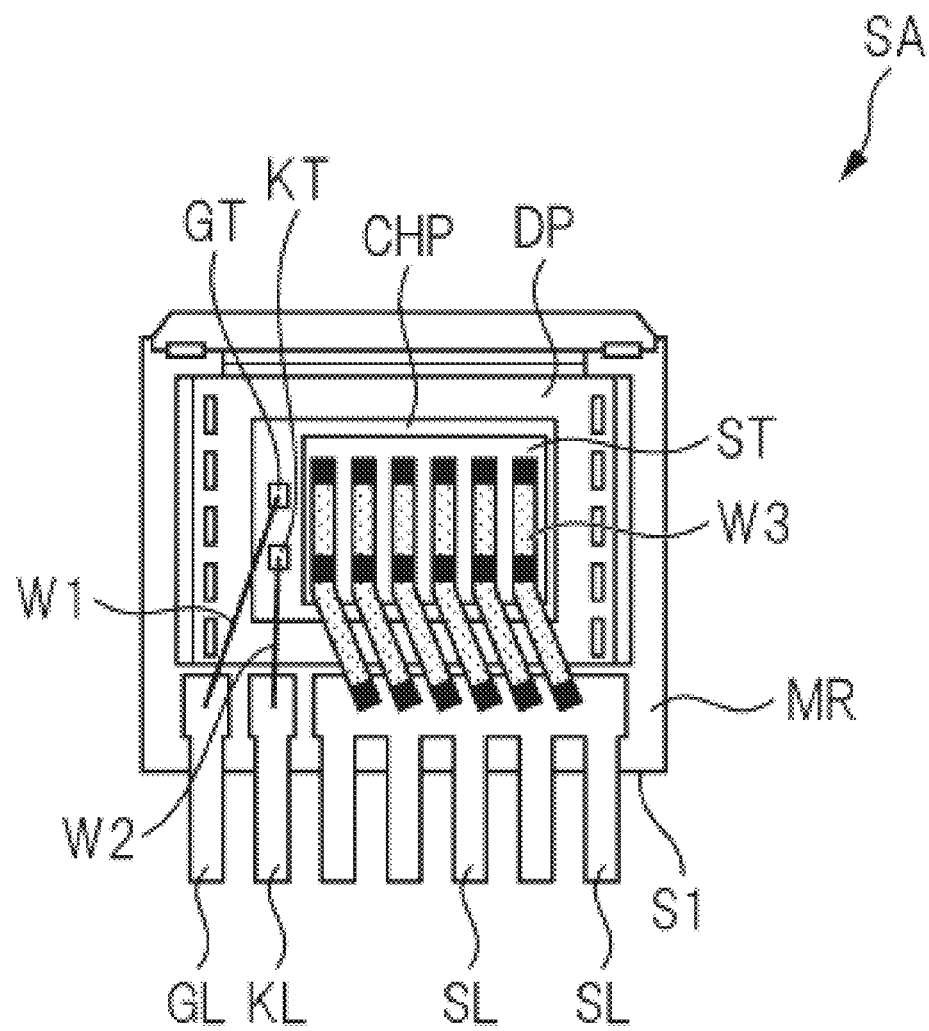
FIG. 3 is a diagram schematically showing an inner structure of a semiconductor device.

FIG. 3 is a diagram schematically showing an inner structure of a semiconductor device SA.

In FIG. 3, for example, the inside of the sealing body MR made of resin, the die pad DP is disposed. A semiconductor chip CHP is mounted on the die pad DP. The semiconductor-chip CHP, a power MOSFET is formed. On the surface of the semiconductor chip CHP, a gate terminal GT electrically connected to the gate electrode of the power MOSFET, the Kelvin terminal KT and the source terminal ST electrically connected to the source region of the power MOSFET is formed. On the other hand, although not shown in FIG. 3, on the back surface of the semiconductor chip CHP, the drain electrode of the power MOSFET is formed, the drain electrode is electrically connected to the die pad DP.

Next, on the side S1 of the sealing body MR, a plurality of leads is arranged so as to project from the sealing body MR. Specifically, the plurality of leads includes a lead GL for the gate terminal, a lead KL for Kelvin terminal, and a lead SL for the source terminal.

The gate terminal lead GL is electrically connected to the gate terminal GT via a wire W1 is a connecting member for the gate terminal. Further, the Kelvin terminal lead KL is electrically connected to the Kelvin terminal KT via a wire W2 is a connecting member for the Kelvin terminal. Furthermore, the source terminal lead SL is electrically connected to the source terminal ST in a plurality of wires W3 is a source terminal connecting member.

In this way, semiconductor device SA, which is a "TO package", is configured.

Here, as shown in FIG. 3, in semiconductor device SA, the Kelvin terminal lead KL is disposed next to the gate terminal lead GL. As a result, by the relative position between the source terminal ST and the source terminal lead SL is shifted, so that the wire W3 connecting the source terminal ST and the source terminal lead SL is bent. That is, in semiconductor device SA, using the bent wire W3, the source terminal ST and the source terminal lead SL is connected. When using such a bent wire W3, it leads to an increase in the resistance value of the wire W3 by the source terminal ST and the source terminal lead SL cannot be connected at the shortest distance.

In this regard, the present inventors have studied to flow a large current of about 300 A (i.e. 300 ampere) to semiconductor device SA, in this case, increasing the resistance value by the bent wire W3 was found to have a non-negligible effect on reducing the on-resistance. In particular, the bent wire W3 is connected to the source terminal ST and the source terminal lead SL for flowing a large current, a large current flows through the bent wire W3 itself. Consequently, since it leads to the generation of large voltage drop and Joule heat even a slight increase in resistance due to bending, the wire W3 bent, when applied to semiconductor device SA of applications carrying a large current, it becomes a factor that leads to a non-negligible performance degradation. Thus, there is room for improvement in semiconductor device SAs, which are "TO package," from the viewpoint of improving performance as represented by reduction of on-resistance.

Therefore, the present inventor has examined in detail the reason why the bent wire W3 must be used in the "TO package" semiconductor device SA, and will explain this point.

As shown in FIG. 3, the cause to have to use the bent wire W3, the result of Kelvin terminal lead KL is disposed next to the lead GL for the gate terminal, the source terminal lead SL in the central portion of the side S1 corresponding to the arrangement position of the source terminal ST it is considered that the main cause cannot be arranged. In this regard, before explaining why it is necessary to place the Kelvin terminal lead KL next to the lead GL for the gate terminal, first, the technical significance of providing the lead KL for the Kelvin terminal will be described.

<<Technical Significance for Providing Kelvin Terminal Lead>>

Figure 4:
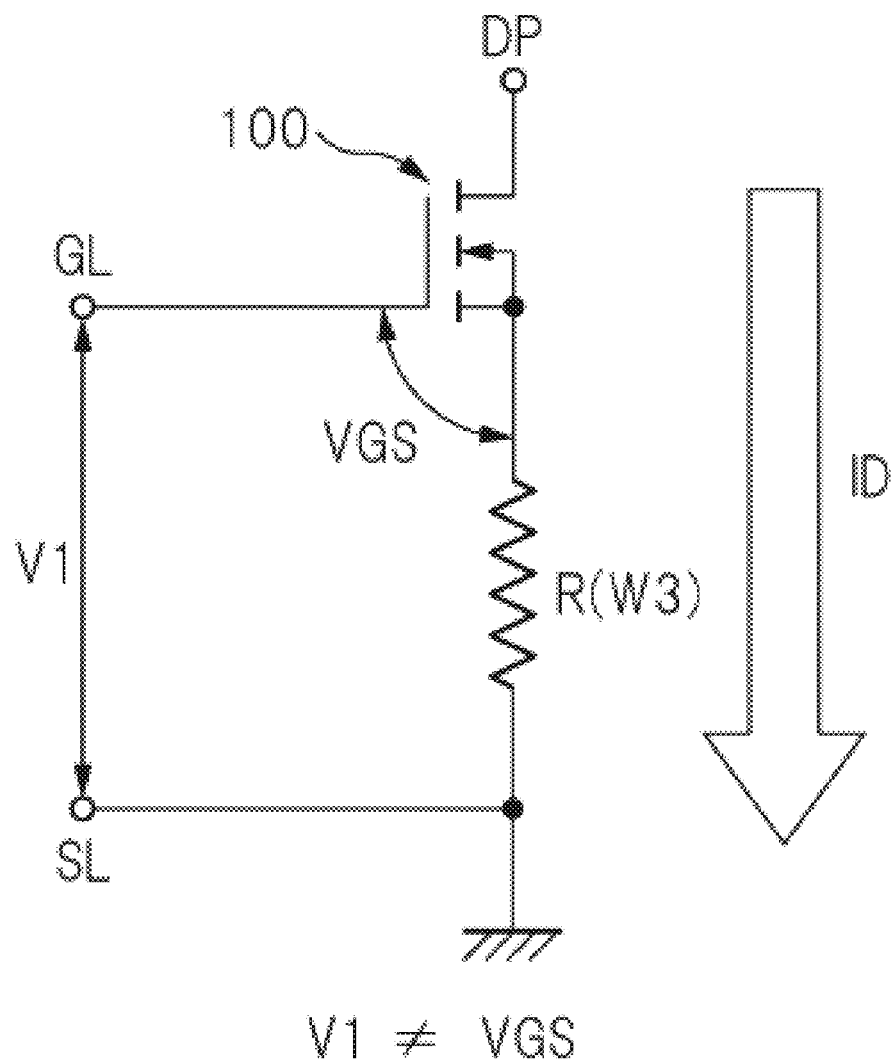
FIG. 4 is a circuit diagram schematically showing a connecting configuration of a power MOSFET when not provided with the Kelvin terminal lead.

FIG. 4 is a circuit diagram schematically showing a connecting configuration of a power MOSFET 100 when not provided with the Kelvin terminal lead KL. As shown in FIG. 4, the power MOSFET 100 is provided between the die pad DP and the source terminal lead SL, "resistor R" represents, for example, a package resistance including a resistance value by the wire W3. Then, the gate electrode of the power MOSFET 100 is electrically connected to the gate terminal lead GL.

Here, the voltage V1 between the source terminal lead SL and the gate terminal lead GL, for example, is input to the gate control circuit GCC shown in FIG. Then, the gate control circuit GCC, based on the input voltage V1, and controls the switching operation of the power MOSFET 100. At this time, in order to stably implement the control of the power MOSFET 100 by the gate control circuit GCC, the voltage V1 is required to be equal to the voltage VGS shown in FIG. 4.

However, in the connection configuration shown in FIG. 4, a large drain current ID flows between the die pad DP and the source terminal lead SL. Thus, a large voltage drop is caused by a large current also flows in the package resistor ("resistor R"). This means that the voltage V1 is a significantly different value from the voltage VGS. Therefore, in the connecting configuration of the power MOSFET 100 shown in FIG. 4, there is a possibility that the control of the power MOSFET 100 by the gate control circuit GCC becomes unstable.

Figure 5:
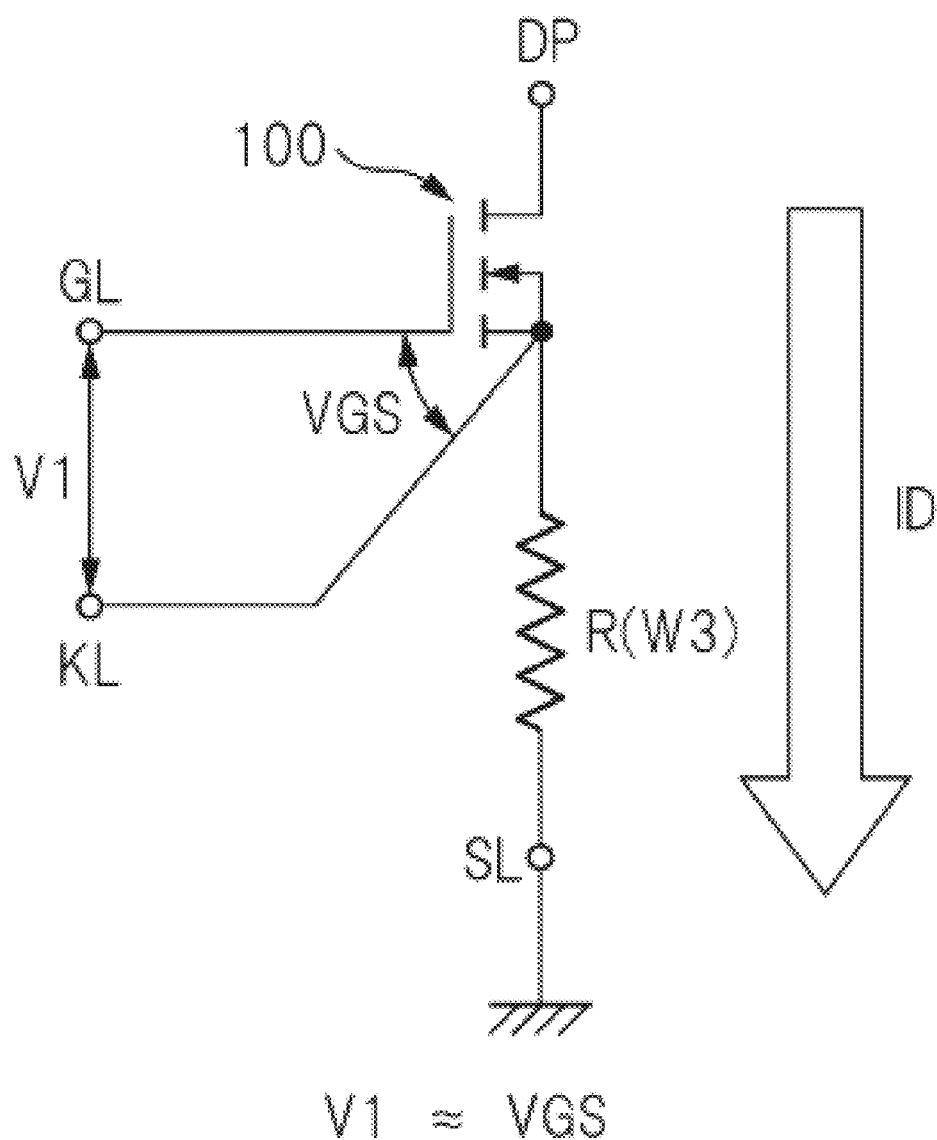
FIG. 5 is a circuit diagram schematically showing a connecting configuration of a power MOSFET when provided with the Kelvin terminal lead.

In contrast, FIG. 5 is a circuit diagram schematically showing a connecting configuration of a power MOSFET 100 when provided with the Kelvin terminal lead KL. In the connecting configuration shown in FIG. 5, not only the source terminal lead SL is connected to the source of the power MOSFET 100 (source terminal), the Kelvin terminal lead KL is also provided to be connected to the source of the power MOSFET 100 (Kelvin terminal). As a result, as shown in FIG. 5, even if a large drain current ID flows between the die pad DP and the source terminal lead SL, the drain current ID does not flow in the Kelvin terminal lead KL. This means that the voltage V1 between the Kelvin terminal lead KL and the gate terminal lead GL is not affected by the voltage drop due to the drain current ID flows through the package resistor ("resistor R"). Thus, the voltage V1 between the Kelvin terminal lead KL and the gate terminal lead GL is substantially equal to the voltage VGS.

Therefore, in the connecting configuration of the power MOSFET 100 shown in FIG. 5, it is possible to stabilize the control of the power MOSFET 100 by the gate control circuit GCC. That is, the Kelvin terminal lead KL, without being affected by the voltage drop caused by the drain current ID, by inputting a voltage V1 having a value substantially equal to the voltage VGS to the gate control circuit GCC, the control of the power MOSFET 100 by the gate control circuit GCC it can be said to have a technical significance of stabilizing.

<Reason for Arranging Kelvin Terminal Lead Next to Gate Terminal Lead>

Considering the technical significance for providing the Kelvin terminal lead KL described above, in order to substantially equal the voltage V1 between the gate terminal lead GL and the Kelvin terminal lead KL to the voltage VGS, the gate terminal lead GL and the Kelvin terminal lead KL it is desirable parasitic resistance between the. For this reason, the lead KL for the Kelvin terminal is disposed next to the lead GL for the gate terminal. Then, in the "TO package", the result of placing the Kelvin terminal lead KL next to the gate terminal lead GL, the wire W3 connecting the source terminal ST and the source terminal lead SL is bent.

In this regard, in the package described above other than the "TO package", since the sides to which a plurality of leads are arranged are also present other sides as well as the first side, even if it is necessary to place the Kelvin terminal lead KL next to the gate terminal lead GL, for example, while placing the gate terminal lead GL and Kelvin terminal lead KL adjacent to each other on the second side different from the first side, by placing the source terminal lead SL on the first side, it is possible to easily realize a configuration that does not bend the source terminal lead SL. However, in the above-described package other than the "TO package", routing of the wiring on the motherboard becomes complicated.

In contrast, in the "TO package", since the sides where a plurality of leads are arranged are limited to the side S1, the advantage that the routing of the wiring in the motherboard is facilitated is obtained. On the other hand, in the "TO package", since the sides where a plurality of leads are arranged are limited to the side S1, when placing the Kelvin terminal lead KL next to the gate terminal lead GL, the source terminal lead SL cannot be arranged in the central portion of the side S1 corresponding to the arrangement position of the terminal ST. Therefore, the Kelvin terminal lead KL is in the way, it becomes difficult to connect the source terminal ST and the source terminal lead SL with the wire W3 of the shortest distance, it is necessary to bend the wire W3. That is, the room for improvement of the bending of the wire W3 is room for improvement that becomes apparent in the "TO package" including the lead KL for the Kelvin terminal.

Therefore, the present embodiment has devised to overcome the room for improvement caused by the bending of the wire W3 which is manifested in the "TO package" including the lead KL for the Kelvin terminal. Hereinafter, the technical idea in the present embodiment to which the present invention is applied will be described.

<Package Configuration of Semiconductor Device>

Figure 6:
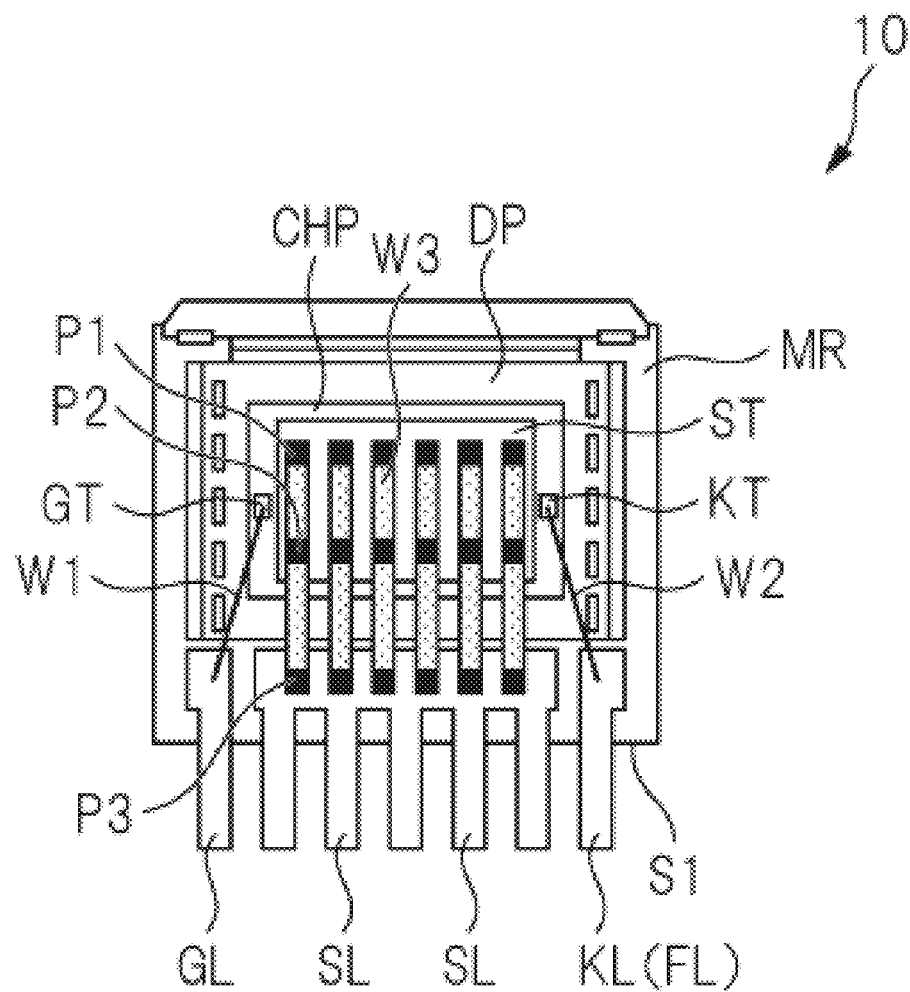
FIG. 6 is a schematic diagram showing a package configuration of a semiconductor device according to an embodiment.

FIG. 6 is a schematic diagram showing a package configuration of a semiconductor device 10 according to an embodiment.

In FIG. 6, semiconductor device 10 is a "TO package" and has a die pad DP disposed inside a sealing member MR made of, for example, a resin. A semiconductor chip CHP is mounted on the die pad DP. The semiconductor-chip CHP, a power MOSFET is formed. On the surface of the semiconductor chip CHP, a gate terminal GT which is electrically connected to the gate electrode of the power MOSFET, a source terminal ST which is electrically connected to the source region of the power MOSFET, the source region of the power MOSFET and the electrically connected Kelvin terminal KT is formed. At this time, as shown in FIG. 6, in plan view, the source terminal ST includes a portion located between the gate terminal GT and the Kelvin terminal KT. On the other hand, although not shown in FIG. 6, on the back surface of the semiconductor chip CHP, the drain electrode is formed, the drain electrode is electrically connected to the die pad DP.

The source terminal ST is a "force terminal" for the purpose of passing a current, and the Kelvin terminal KT is a "sense terminal" for the purpose of detecting a voltage.

Next, as shown in FIG. 6, a plurality of leads is arranged on the side S1 of the sealing body MR so as to project from the sealing body MR. In other words, along the first side of the semiconductor chip parallel to the sides S1 of the sealing body MR, a plurality of leads is arranged. Specifically, the plurality of leads includes a lead GL for the gate terminal, a lead KL for Kelvin terminal, and a lead SL for the source terminal. Gate terminal lead GL is electrically connected to the gate terminal GT via a wire (bonding wire) W1 is a connecting member for the gate terminal. Further, the Kelvin terminal lead KL is electrically connected to the Kelvin terminal KT via a wire (bonding wire) W2 is a connecting member for the Kelvin terminal. Furthermore, the source terminal lead SL is electrically connected to the source terminal ST in a plurality of wires (bonding wires) W3 is a source terminal connecting member. In the present embodiment, each of the wires W1, W2, and W3 is comprised of gold (Au), for example, but a wire comprised of copper (Cu) may be used.

Here, in the present embodiment, as shown in FIG. 6, the lead GL for the gate terminal and the lead KL for the Kelvin terminal are not arranged so as to be adjacent to each other, between the lead GL for the gate terminal and the lead KL for the Kelvin terminal a plurality of source terminal lead SL is disposed.

Then, each of the plurality of wires W3 for electrically connecting the source terminal ST with the source terminal lead SL is formed in a linear shape extending in the y-direction (second direction) perpendicular to the x-direction (first direction) in which the side S1 is extended. In other words, each of the plurality of wires W3 is composed of a straight shape extending only in the y-direction perpendicular to the x-direction.

Further, as shown in FIG. 6, each of the plurality of wires W3 is bonded at a plurality of locations and the source terminal ST. For example, each wire W3 and the source terminal ST is connected at the junction P1 and junction P2. That is, the number of junctions between the wire W1 and the gate terminal GT is one, also, whereas the number of junctions between the wire W2 and the Kelvin terminal KT is one, the number of junctions between each wire W3 and the source terminal ST is two. That is, by increasing the junction between each of the source terminal ST and a plurality of wires W3, it is possible to reduce the on-resistance on the current path between the source terminal ST and the source terminal lead SL. Then, as shown in FIG. 6, the source terminal ST and the source terminal lead SL via a plurality of wires W3 to each other, and not only electrically connected, by joining each wire W3 at a source terminal ST and a plurality of locations, between the source terminal ST and the source terminal lead SL it is possible to flow a large current (300 A, namely, 300 ampere). In the present embodiment, as shown in FIG. 6, the number of bonding points between the wires W3 and the source terminals ST is two, but the number may be two or more.

On the other hand, each wire W3 and the source terminal lead SL is connected at the junction P3. That is, the number of bonding points between each wire W3 and the source terminal lead SL is one. This is because, as shown in FIG. 6, the area of the source terminal lead SL (in particular, the length of the source terminal lead SL along the y direction in which the wire W3 extends) is smaller than the area of the source terminal ST (in particular, the length of the source terminal ST along the y direction in which the wire W3 extends) (short).

In this manner, the semiconductor device 10, which is a "TO package", is configured to flow a current of 300 A (i.e. 300 ampere), for example.

<Device Structure of Power MOSFET>

Figure 7:
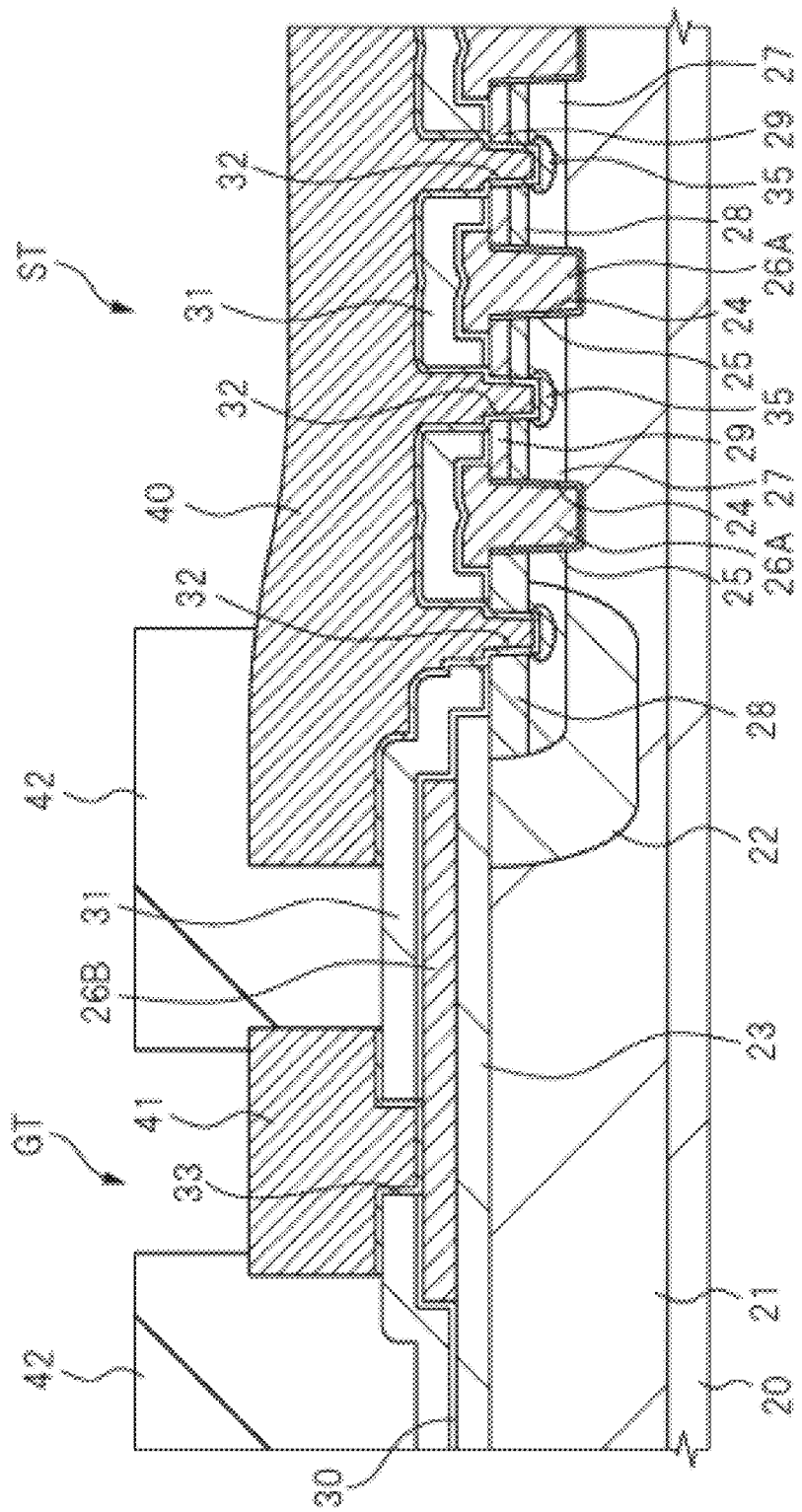
FIG. 7 is an enlarged cross-sectional view of a semiconductor chip showing a trench gate type power MOSFET of an n-channel type, which is an example of a power MOSFET.

Subsequently, the device structure of the power MOSFET formed on the semiconductor chip CHP. FIG. 7 is an enlarged cross-sectional view of a semiconductor chip CHP showing a trench gate type power MOSFET of an n-channel type, which is an example of a power MOSFET.

In FIG. 7, an epitaxial layer 21 made of n− type monocrystalline silicon is formed on a surface of a semiconductor substrate 20 made of n+ type monocrystalline silicon. The semiconductor substrate 20 and the epitaxial layer 21 constitutes a drain of the power MOSFET.

A p-type well 22 is formed in a part of the epitaxial layer 21. A silicon oxide film 23 is formed on a part of the surface of the epitaxial layer 21, and a plurality of grooves 24 are formed on the other part. A region of the surface of the epitaxial layer 21, which is covered with the silicon oxide film 23, constitutes an element isolation region, while a region in which the trench 24 is formed constitutes an element formation region. Although not shown, the planar shape of the groove 24 is a square, hexagonal, a polygon such as an octagonal or a stripe shape extending in one direction.

The bottom and side walls of the groove 24, the silicon oxide film 25 constituting the gate insulating film of the power MOSFET is formed. Further, inside the groove 24, polycrystalline silicon film 26A constituting the lower gate electrode of the power MOSFET is embedded. On the other hand, the upper portion of the silicon oxide film 23, the gate-drawing electrode 26B made of polycrystalline silicon film deposited in the same process as the polycrystalline silicon film 26A is formed. Lower gate electrode (polycrystalline silicon film 26A) and the gate extraction electrode 26B is electrically connected in a region (not shown).

In the epitaxial layer 21 of the device forming region, a p− semiconductor region 27 shallower than the trench 24 is formed. p− semiconductor region 27 is called a body region, and is a region in which a channel region (inversion layer) of a power MOSFET is formed. The upper portion of p-type solid state region 27, a higher p-type solid state region 28 of p− type solid state region 27 is formed, further, the upper portion of the p-type solid state region 28, n+ type solid state region 29 is formed. The p-type semiconductor region 28 constitutes a punch-through stopper layer of the power MOSFET, while n+ type semiconductor region 29 constitutes a source region of the power MOSFET.

Two layers of a silicon oxide film 30 and a silicon oxide film 31 are formed on the element forming region where the power MOSFET is formed and on the element isolating region where the gate lead-out electrodes 26B are formed. In the device forming region, a connecting hole 32 is formed which penetrates the silicon oxide film 30, the silicon oxide film 31, the p-type semiconductor region 28, and n+ type semiconductor region 29 and reaches p− type semiconductor region 27. Connecting holes 33 are formed in the isolation regions so as to penetrate the silicon oxide film 30 and the silicon oxide film 31 and reach the gate-lead electrodes 26B.

The upper portion of the silicon oxide film 31 including the inside of the connection hole 32 and the connection hole 33, for example, a source electrode 40 and the gate electrode 41 composed of a laminated film of a thin titanium tungsten film (TiW film) and a thick aluminum film (Al film) is formed. Source electrode 40 formed in the element forming region is electrically connected to the source region of the power MOSFET through the connection hole 32. The bottom of the connecting hole 32, a p+ type solid-state region 35 for ohmically contacting the source terminal ST and p− type solid-state region 27 is formed. Further, the gate electrode 41 formed in the element isolation region is connected to the lower gate electrode of the power MOSFET through the gate extraction electrode 26B of the lower portion of the connection hole 33 (polycrystalline silicon film 26A).

The upper portion of the source electrode 40 and the gate electrode 41, the surface protective film 42 composed of a laminated film of a silicon oxide film and a silicon nitride film is formed. Then, the source terminal ST is formed by exposing the source electrode 40 by removing a portion of the surface protective film 42, the gate terminal GT is formed by exposing the gate electrode 41 by removing another portion of the surface protective film. Although not shown in FIG. 7, Kelvin terminal is also formed.

As described above, so that the gate terminal GT and the Kelvin terminal (KT) and the source terminal ST on the main surface of the semiconductor chip CHP is formed.

Features in Embodiments

Next, the characteristic points in the present embodiment will be described.

The features in the present embodiment, for example, as shown in FIG. 6, in that placing the source terminal lead SL between the lead GL for the gate terminal and the Kelvin terminal lead KL in plan view. Thus, it is possible to place the source terminal lead SL in the central portion of the side S1 corresponding to the arrangement position of the source terminal ST, it is possible to suppress the wire W3 connecting the source terminal ST and the source terminal lead SL is bent. That is, according to the feature point in the present embodiment, it is possible to construct a wire W3 connecting the source terminal ST and the source terminal lead SL from a linear shape extending in the y direction perpendicular to the x direction in which the side S1 extends. In other words, according to the feature point in the present embodiment, each of the plurality of wires W3 can be constructed from a straight shape extending only in the y-direction perpendicular to the x-direction.

Consequently, according to the present embodiment, since the plurality of wires W3 flowing a large current of about 300 A (i.e. 300 ampere) is not bent, it is possible to suppress a non-negligible performance deterioration represented by an increase in the on-resistance and parasitic inductance due to the bending of the wire W3. That is, according to the present embodiment, it is possible to connect the source terminal ST and the source terminal lead SL with the shortest length of the wire W3, it is possible to improve the performance of semiconductor device 10.

Here, as described in the item "<REASON FOR ARRANGING KELVIN TERMINAL LEAD NEXT TO GATE TERMINAL LEAD>", in order to substantially equal the voltage V1 between the gate terminal lead GL and the Kelvin terminal lead KL to the voltage VGS, it is desirable that the parasitic resistance between the gate terminal lead GL and the Kelvin terminal lead KL is small. For this reason, a configuration in which the lead KL for the Kelvin terminal is arranged next to the lead GL for the gate terminal has been adopted.

In this regard, the circuit for detecting the voltage V1 by the lead GL for the gate terminal and the lead KL for the Kelvin terminal is a sense circuit for detecting a voltage rather than a circuit for passing a current. This, even if a little resistance is applied to the sense circuit, since the large current does not flow, the present inventors have thought that the influence of the voltage drop on the detection of the voltage V1 is also small. That is, the present inventor has reached the ruling that the influence on the detection of the voltage V1 is not large even if the distance between the lead GL for the gate terminal and the Kelvin terminal lead KL. Rather, the present inventor has, in semiconductor device 10 used in applications that flow a large current of about 300 A (i.e. 300 ampere), the effect of the increase in the on-resistance and parasitic inductance due to the wire W3 through which a large current flows is bent is greater on the performance reduction of semiconductor device 10 it was considered.

In view of the above, the present inventor, instead of the configuration of arranging the lead GL for gate terminal and the lead KL for Kelvin terminal so as to be adjacent to each other, the gate terminal lead GL and the lead KL for Kelvin terminal in a plan view it has come to adopt the configuration of the feature point in the present embodiment of placing the lead SL for source terminal between the lead KL. Consequently, according to the present embodiment, it is possible to suppress the non-negligible performance degradation represented by an increase in the on-resistance and the parasitic inductance due to the bending of the wire W3, thereby, it was possible to obtain a remarkable effect that it is possible to improve the performance of the semiconductor device 10.

<<Upper Conceptualization of Terminal>>

In the present embodiment, as the switching element Q1 formed in the semiconductor chip CHP, it has been described as an exemplary power MOSFET. In this case, the surface of the semiconductor chip CHP, the gate terminal GT and the Kelvin terminal KT and the source terminal ST is formed.

However, the technical idea in the present embodiment is not limited to the mode in which the switching element Q1 is formed of the power MOSFET, and can also be applied to the mode in which the switching element Q1 is formed of the power IGBT. In this case, the surface of the semiconductor chip CHP, so that the gate terminal GT and the Kelvin terminal KT and the emitter terminal are formed.

Then, the Kelvin terminal KT is a terminal for detecting a voltage, since the terminal for detecting the voltage is referred to as a "sense terminal", the Kelvin terminal KT is an aspect of the "sense terminal". Further, the source terminal ST and the emitter terminal is a terminal for passing a current, the terminal intended to flow a current is referred to as a "force terminal", the source terminal ST and the emitter terminal is an aspect of the "force terminal".

Further, as will be described in modified example below, considering that each wire (bonding wire) W1-W3 may be replaced with a "ribbon" or "clip", "wire," "ribbon," and "clip" are one aspect of the connecting member.

Based on the above, the following is a superordinate conceptualization of terms.
(1) Gate Terminal GT
(2) Kelvin Terminal KT→"Sense Terminal"
(3) Source Terminal ST and Emitter Terminal→"Force Terminal"
(4) Gate Terminal Lead GL
(5) Kelvin Terminal Lead KL→"Sense Terminal Lead"
(6) Source Terminal Lead SL (Emitter Terminal Lead) →"Force Terminal Lead"
(7) Wire W1→"Gate Terminal Connecting Member"
(8) Wire W2→"Sense Terminal Connecting Member"
(9) Wire W3 (ribbon, clip)→"Force Terminal Connecting Member"

Considering the upper conceptualization of such terms, the characteristic point in the present embodiment is to place the "lead for force terminal" between the lead GL for gate terminal and the "lead for sense terminal" in a plan view. Thus, since it is possible to place the force terminal lead in the central portion of the side corresponding to the arrangement position of the force terminal, the force terminal connecting member for connecting the force terminal and the force terminal lead is prevented from bending. That is, according to the feature point in the present embodiment, it is possible to construct the "connecting member for the force terminal" connecting the "force terminal" and the "lead for the force terminal" from a linear shape. In other words, according to the feature point in the present embodiment, the "connecting member for the force terminal" can be constructed from a straight shape.

Modified Example 1

Figure 8:
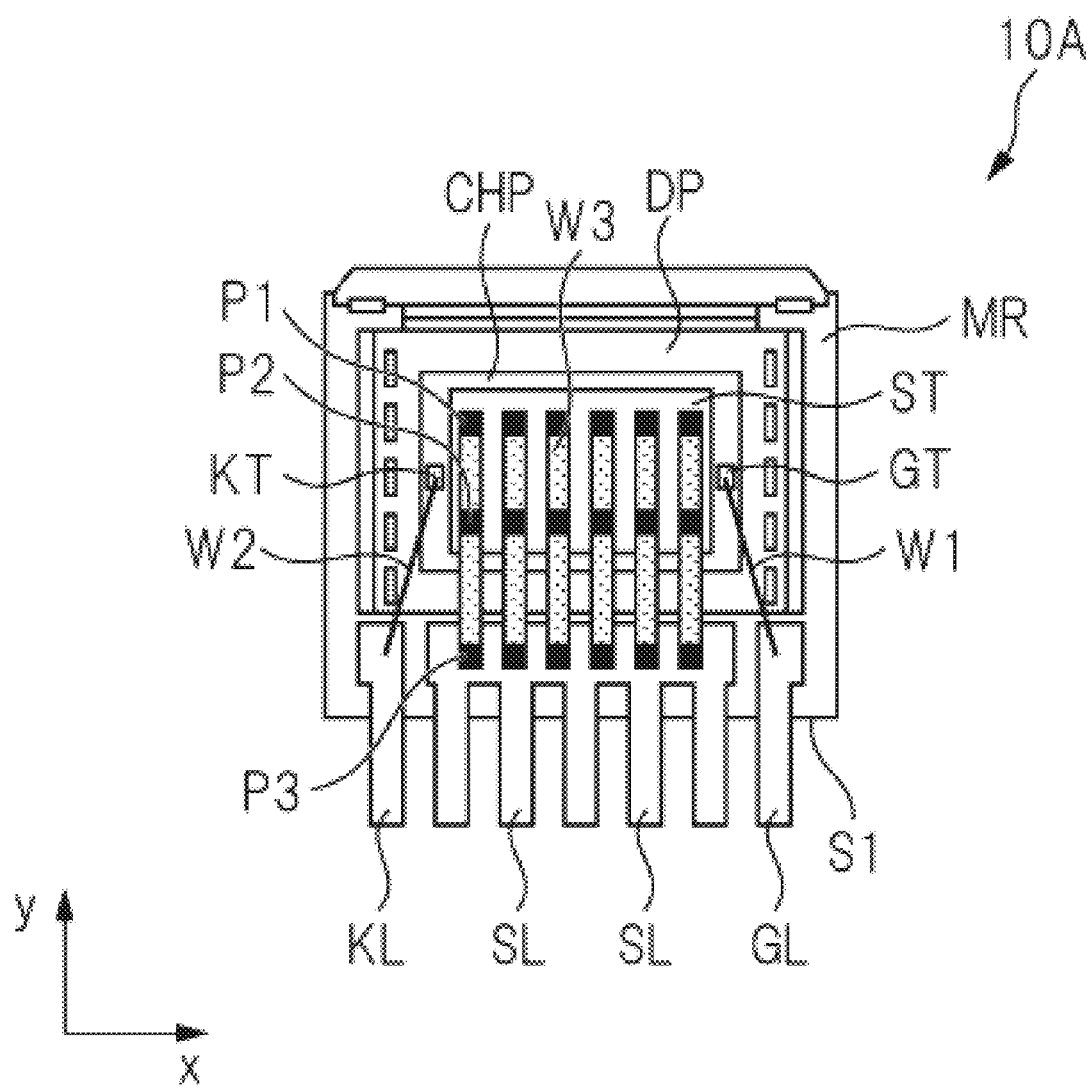
FIG. 8 is a diagram showing a schematic configuration of a semiconductor device according to a first modified example.

FIG. 8 is a diagram showing a schematic configuration of a semiconductor device 10A according to a first modified example.

As shown in FIG. 8, in semiconductor device 10A of the present first modified example, with respect to semiconductor device 10 shown in FIG. 6, the position of the gate terminal GT formed in the semiconductor chip CHP and the Kelvin terminal KT is replaced. Thus, in semiconductor device 10A, the gate terminal lead GL connected to the gate terminal GT via the wire W1, the position of the Kelvin terminal lead KL connected to the Kelvin terminal KT via the wire W2 is also replaced.

As described above, when employing the feature point in the present embodiment of "ARRANGING SOURCE TERMINAL LEAD SL BETWEEN GATE TERMINAL LEAD GL AND KELVIN TERMINAL LEAD KL IN PLAN VIEW", a symmetrical mounting configuration is realized with respect to the lead GL for the gate terminal and the lead KL for the Kelvin terminal. Consequently, when employing the feature point in the present embodiment are adopted, not only the configuration of semiconductor device 10 shown in FIG. 6 but also the configuration of semiconductor device 10A shown in FIG. 8 can be realized. Therefore, the technical idea in the present embodiment is also a valuable technical idea in that variations in implementation layouts can be increased.

Modified Example 2

Figure 9:
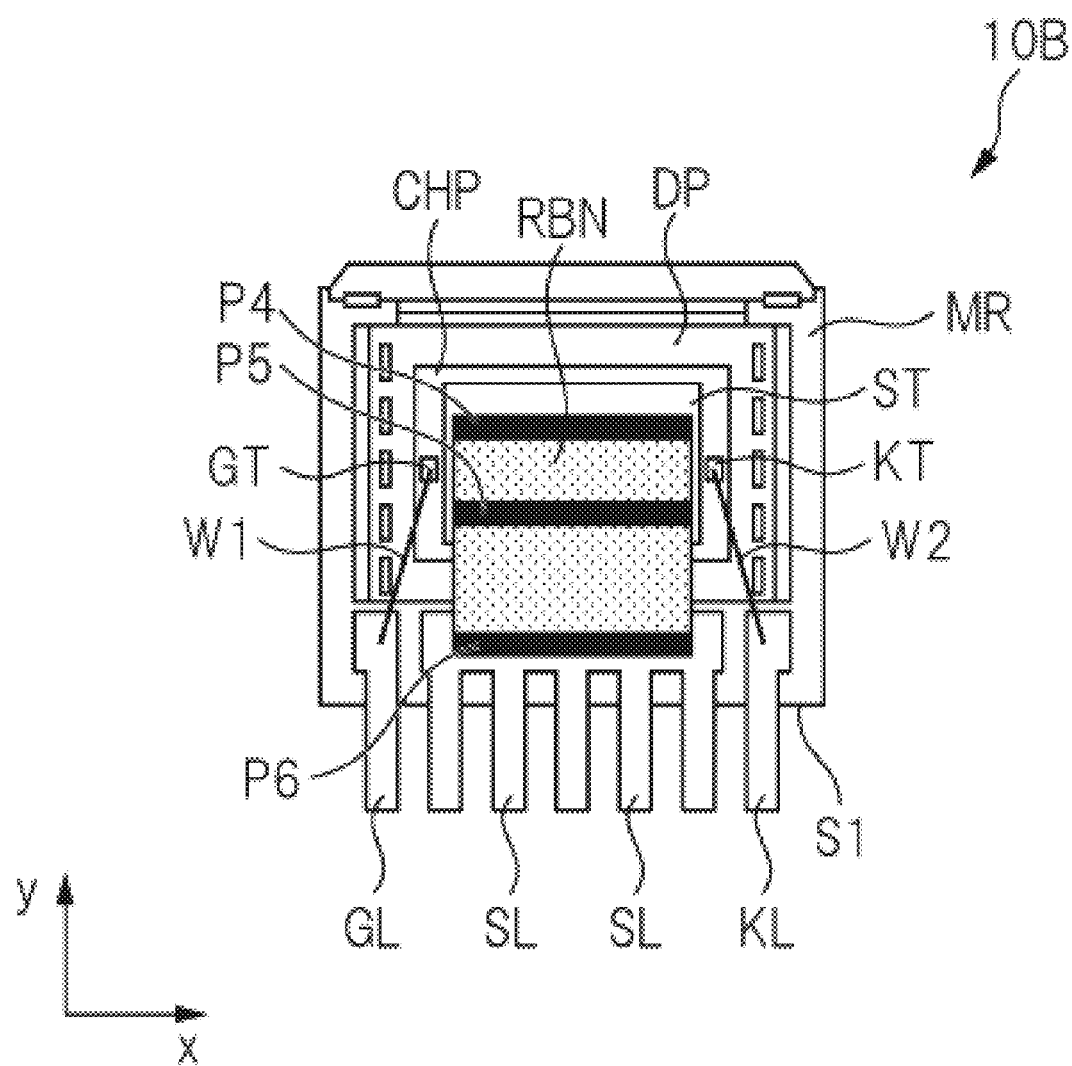
FIG. 9 is a diagram showing a schematic configuration of a semiconductor device according to a second modified example.

FIG. 9 is a diagram showing a schematic configuration of a semiconductor device 10B according to a second modified example.

In FIG. 9, when employing the feature point in the present embodiment, it is possible to place the source terminal lead SL in the central portion of the side S1 corresponding to the arrangement position of the source terminal ST. Therefore, as the source terminal connecting member for connecting the source terminal ST and the source terminal lead SL, instead of the wire W3 shown in FIG. 6, it is also possible to use a ribbon RBN made of aluminum (Al).

In this case, as shown in FIG. 9, the ribbon RBN is joined at a plurality of locations with the source terminal ST. For example, the ribbon RBN and the source terminal ST are connected at the junction P4 and junction P5. That is, the number of junctions between the wire W1 and the gate terminal GT is one, also, whereas the number of junctions between the wire W2 and the Kelvin terminal KT is one, the number of junctions between the ribbon RBN and the source terminal ST is two. That is, as in the above embodiment, by increasing the junction between the source terminal ST and the ribbon RBN, it is possible to reduce the on-resistance on the current path between the source terminal ST and the source terminal lead SL. Here, the width of the ribbons RBNs used in the present second modified example is larger than the width of the wires W1 to W3 used in the above embodiment. Then, as shown in FIG. 9, the source terminal ST and the source terminal lead SL via one ribbon RBN to each other, and not only electrically connected, by joining the ribbon RBN at a source terminal ST and a plurality of locations, between the source terminal ST and the source terminal lead SL it is possible to flow a large current (300 A, namely 300 ampere). Incidentally, in the present second modified example, as shown in FIG. 9, the number of junctions between the ribbon RBN and the source terminal ST has been described to be two, it may be two or more. The ribbon RBN and the source terminal lead SL are connected to each other at a junction P6. That is, the number of junction points between the ribbon RBN and the source terminal lead SL is one.

Modified Example 3

Figure 10:
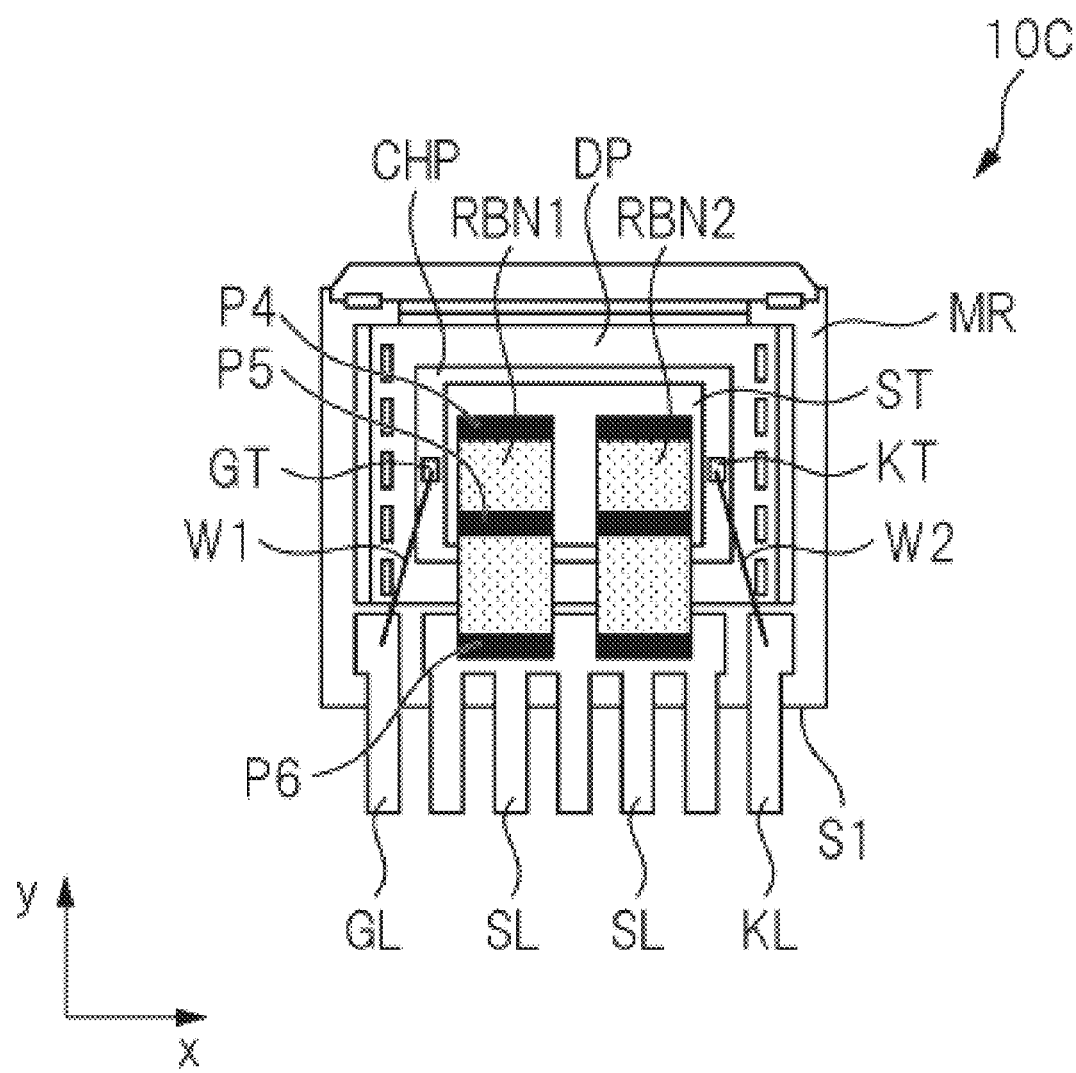
FIG. 10 is a diagram showing a schematic configuration of a semiconductor device in third modified example.

FIG. 10 is a diagram showing a schematic configuration of a semiconductor device 10C in third modified example.

In FIG. 10, when employing the feature point in the present embodiment, it is possible to place the source terminal lead SL in the central portion of the side S1 corresponding to the arrangement position of the source terminal ST. Therefore, as the source terminal connecting member for connecting the source terminal ST and the source terminal lead SL, instead of the wire W3 shown in FIG. 6, not only using the ribbon RBN shown in FIG. 9, as shown in FIG. 10, it is also possible to use a ribbon RBN1 and ribbon RBN2.

Modified Example 4

Figure 11:
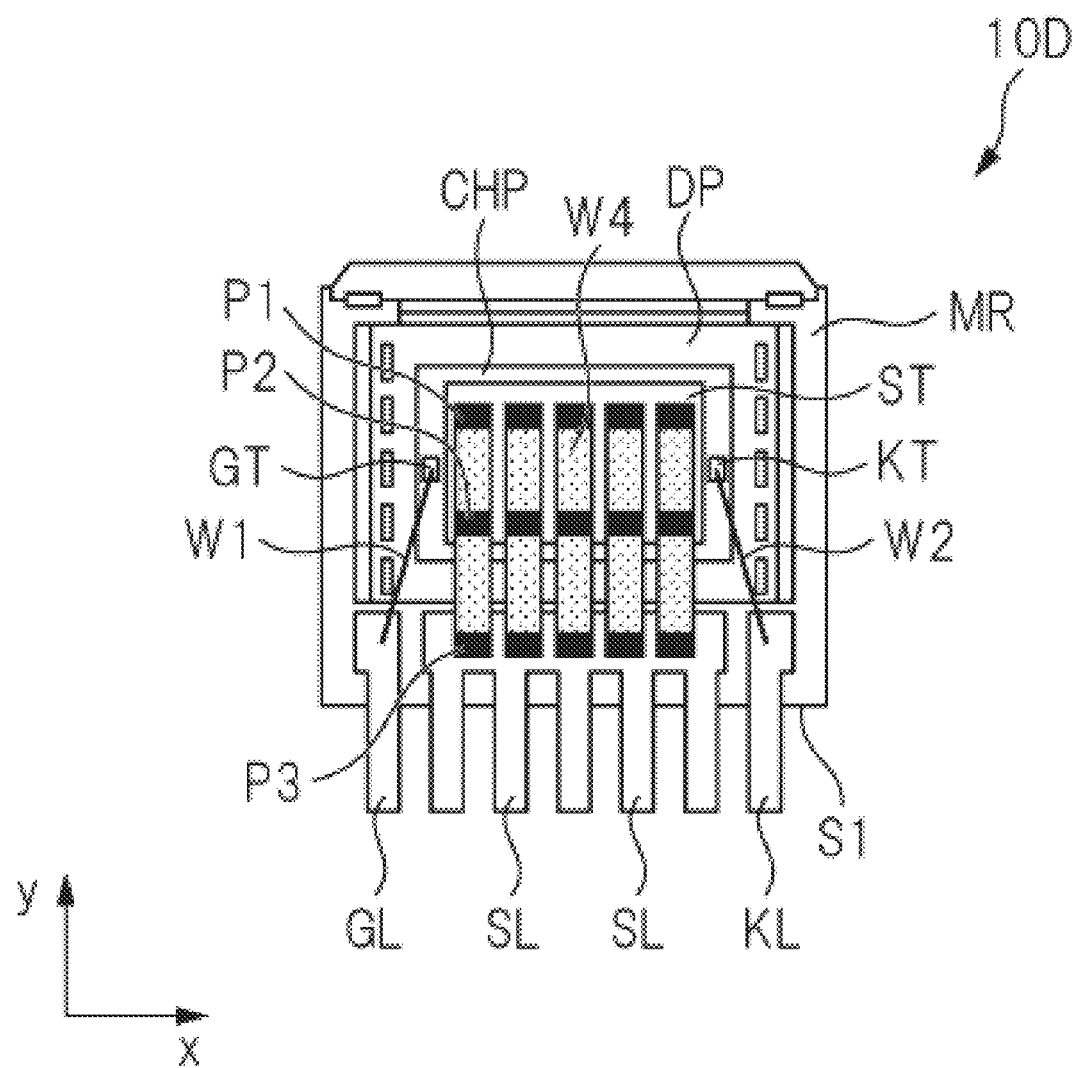
FIG. 11 is a diagram showing a schematic configuration of a semiconductor device according to a fourth modified example.

FIG. 11 is a diagram showing a schematic configuration of a semiconductor device 10D according to a fourth modified example.

In FIG. 11, when employing the feature point in the present embodiment, it is possible to place the source terminal lead SL in the central portion of the side S1 corresponding to the arrangement position of the source terminal ST. Therefore, as the source terminal connecting member for connecting the source terminal ST and the source terminal lead SL, instead of the wire W3 shown in FIG. 6, it is also possible to use a wide wire W4 shown in FIG. 11.

Modified Example 5

Figure 12:
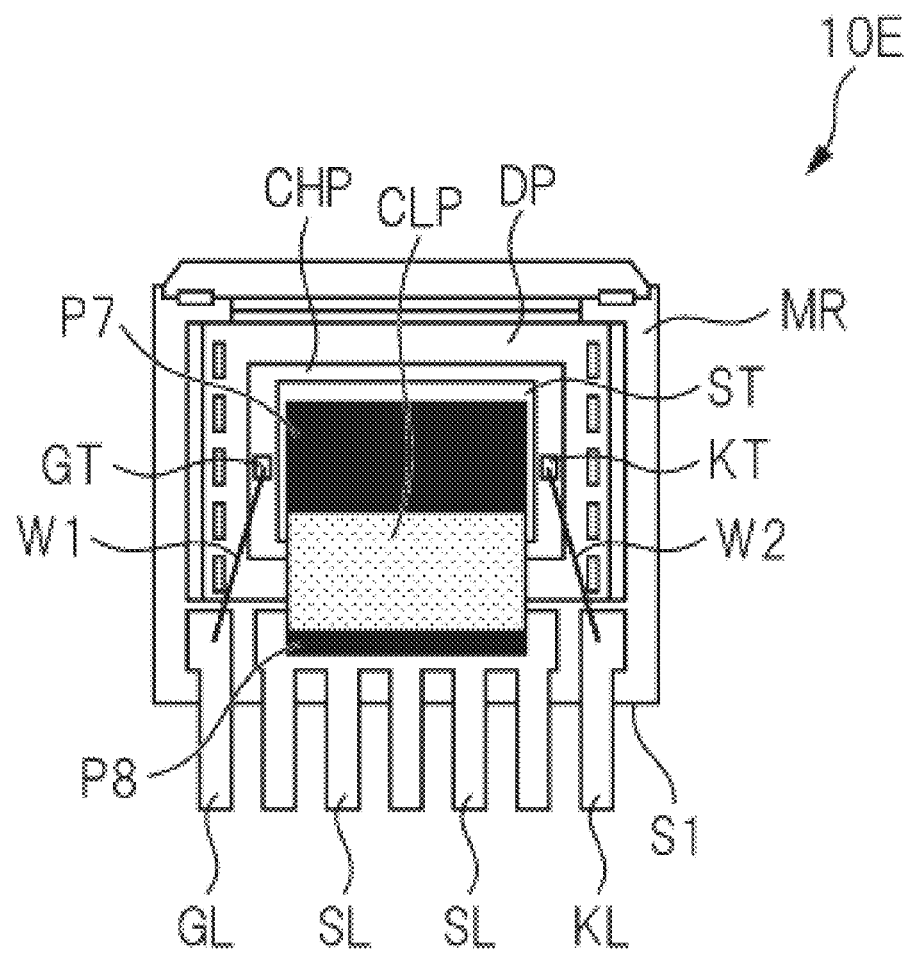
FIG. 12 is a diagram showing a schematic configuration of a semiconductor device according to a fifth modified example.

FIG. 12 is a diagram showing a schematic configuration of a semiconductor device 10E according to a fifth modified example.

In FIG. 12, when employing the feature point in the present embodiment, it is possible to place the source terminal lead SL in the central portion of the side S1 corresponding to the arrangement position of the source terminal ST. Therefore, as the source terminal connecting member for connecting the source terminal ST and the source terminal lead SL, instead of the wire W3 shown in FIG. 6, it is also possible to use the clip CLP shown in FIG. 12.

In this case, as shown in FIG. 12, the clip CLP is joined to the source terminal ST at one point. For example, the clip CLP and the source terminal ST are connected to each other at a junction point P7. That is, the number of junctions between the wire W1 and the gate terminal GT is one, also the number of junctions between the wire W2 and the Kelvin terminal KT is one, further, the number of junctions between the clip CLP and the source terminal ST is also one. Here, the width of the clips CLPs used in the present fifth modified example is larger than the width of the wires W1 to W3 used in the above embodiment. The thickness of the clips used in this fifth modified example is greater than the thickness of the ribbons RBNs used in the above second modified example. Therefore, unlike the above embodiment and the above second modified example, without increasing the junction between the source terminal ST and the clip CLP, with a width and thickness as described above, and a clip CLP made of copper (Cu) by using, it is possible to reduce the on-resistance on the current path between the source terminal ST and the source terminal lead SL. The clip CLP and the source terminal lead SL are connected to each other at a junction point P8. That is, the number of junction points between the clip CLP and the source terminal lead SL is one.

Further Benefits in Embodiments

For example, in the "TO package" arranged so as to be adjacent to the lead GL for the gate terminal and the Kelvin terminal lead KL, as a configuration example so as not to bend the wire W3 connecting the source terminal ST and the source terminal lead SL, straight wire W3 which is not bent it is also conceivable to arrange the W3 obliquely. The technical idea in the present embodiment explains that the technology has an advantage over the related art.

Figure 13:
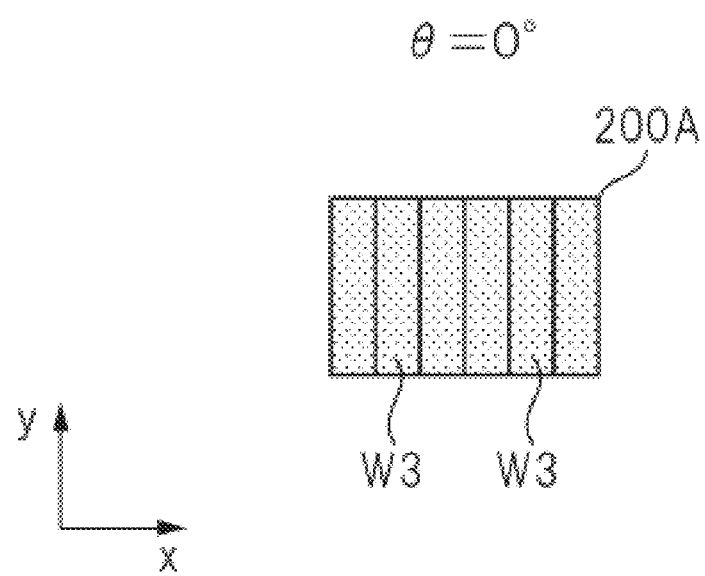
FIG. 13 is a diagram schematically showing an arrangement of a wire that embodied a technical philosophy according to an embodiment.

FIG. 13 is a diagram schematically showing an arrangement of a wire W3 that embodied a technical philosophy according to an embodiment. In FIG. 13, the wire W3 is composed of a linear shape extending only in the y direction, the wire angle θ indicating the inclination of the wire W3 from the y direction is 0°. In this case, for example, represents the area of the semiconductor chip required to place the six wires W3 in the occupied area 200A.

Figure 14:
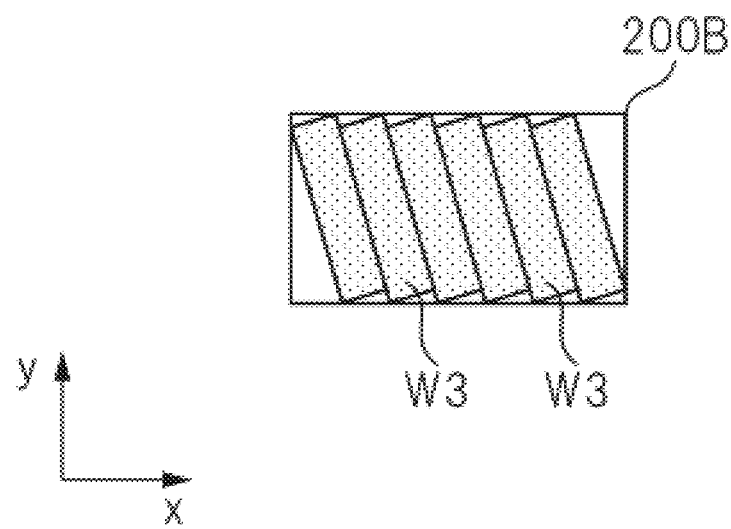
FIG. 14 is a diagram schematically showing an arrangement of a wire that embodied an example of the related art.

Next, FIG. 14 is a diagram schematically showing an arrangement of a wire W3 that embodied an example of the related art. In FIG. 14, the wire W3 is composed of a linear shape inclined from the y direction, the wire angle θ indicating the inclination of the wire W3 from the y direction is 12°. In this case, for example, represents the area of the semiconductor chip required to place the six wires W3 in the occupied area 200B.

Figure 15:
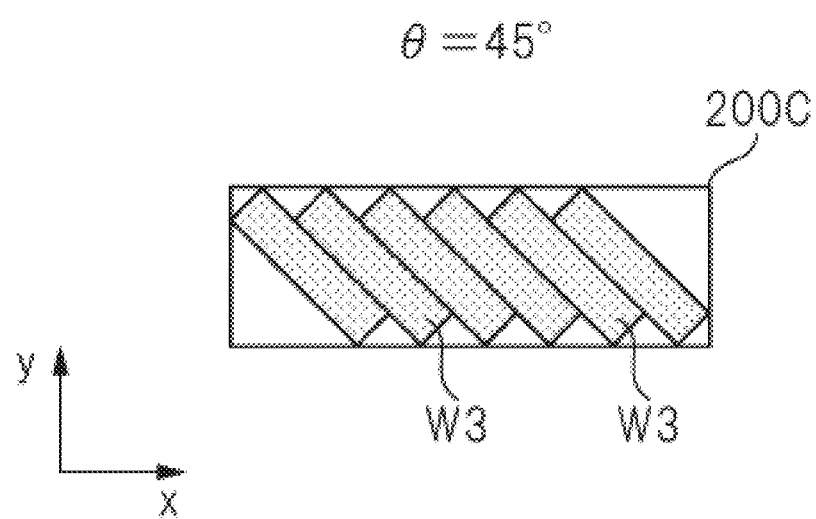
FIG. 15 is a diagram schematically showing an arrangement of a wire that embodied another example of the related art.

Next, FIG. 15 is a diagram schematically showing an arrangement of a wire W3 that embodied another example of the related art. In FIG. 15, the wire W3 is composed of a linear shape inclined from the y direction, the wire angle θ indicating the inclination of the wire W3 from the y direction is 45°. In this case, for example, represents the area of the semiconductor chip required to place the six wires W3 in the occupied area 200C.

As can be seen from FIGS. 13 to 15, the area of the semiconductor chip required to arrange the six wires W3 is "occupied area 200A<occupied area 200B<occupied area 200C". That is, when the wire W3 is formed in a linear shape extending only the y-direction by embodying the technical philosophy in the present embodiment, it can be seen that it is possible to reduce the occupied area of the wire W3 in the semiconductor chip, compared to when the wire W3 is formed in a linear shape inclined from the y-direction by embodying the related art. This means, according to the present embodiment, that if the number of wires W3 to be used is the same, the size of the semiconductor chip can be shrinked over the related art. Thus, the technical philosophy in the present embodiment is superior in that not only the on-resistance can be reduced, but also the size of the semiconductor chip can be reduced.

Figure 16:
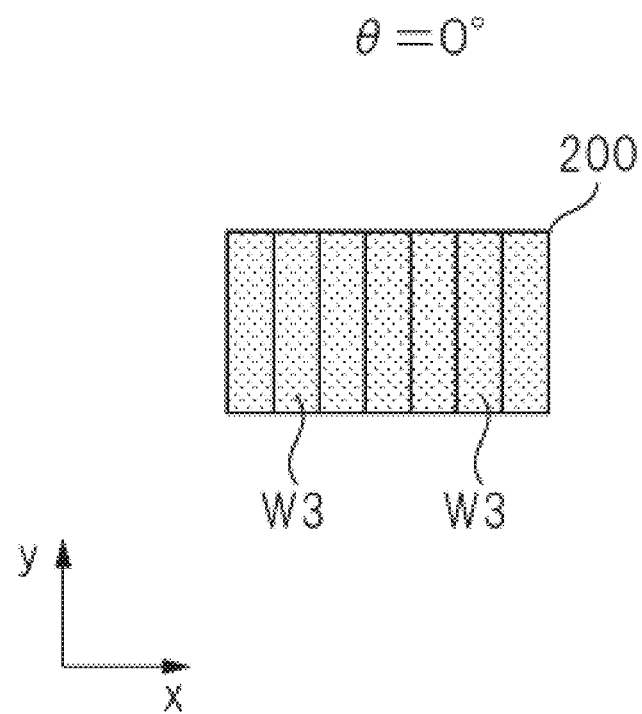
FIG. 16 is a diagram schematically showing a configuration for arranging a wire that embodied the technical philosophy according to the present embodiment when it is set an occupied area of the semiconductor chip as a constant area.

In addition, the superiority of technical ideas in the present embodiment over related technologies will be explained using other expressions. 16, when the occupied area of the semiconductor chip and the area 200 is a diagram schematically showing a configuration for arranging the wire W3 embodying the technical philosophy in the present embodiment. As shown in FIG. 16, using a wire W3 composed of a linear shape extending only in the y direction, it is possible to place seven wires W3 in the area 200.

Figure 17:
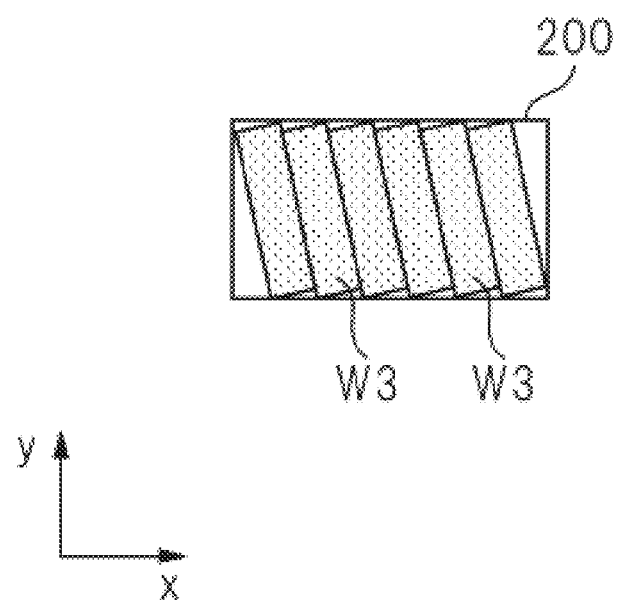
FIG. 17 is a diagram schematically showing a configuration for arranging a wire that embodied the related art.

On the other hand, FIG. 17, when the occupied area of the semiconductor chip and the area 200 is a diagram schematically showing a configuration for arranging the wire W3 embodying the related art. As shown in FIG. 17, using the wire W3 composed of a linear shape inclined from the y direction, it can be seen that it is possible to arrange only six wires W3 in the area 200.

Thus, applying the technical philosophy in the present embodiment to the shape of the wire W3, it can be seen that the number of wires W3 that can be arranged in the area 200 of the same semiconductor chip can be increased than the related art. This means that when using semiconductor chips of the same size, the present embodiment can reduce on-resistance by increasing the number of wires W3 that can be placed on the semiconductor chip rather than the related art.

Therefore, from this viewpoint as well, the technical idea in the present embodiment can be said to be excellent.

Application Example

Next, an application example of the technical idea in the present embodiment will be described. Specifically, we describe that the layout of several leads in the present embodiment is applicable not only to semiconductor device containing powered MOSFET, but also to semiconductor device containing bidirectional thyristors. In other words, we explain that devising the layout of several leads contributes to the standardization of semiconductor device including powered MOSFET and semiconductor device including bidirectional thyristors.

Figure 18:
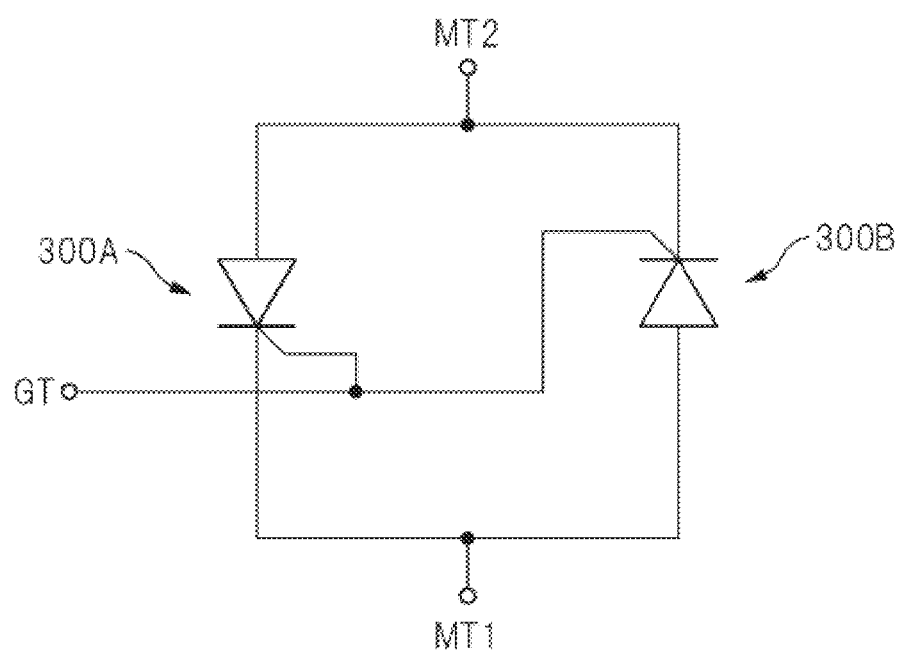
FIG. 18 is a circuit diagram of a bidirectional thyristor.
Figure 19:
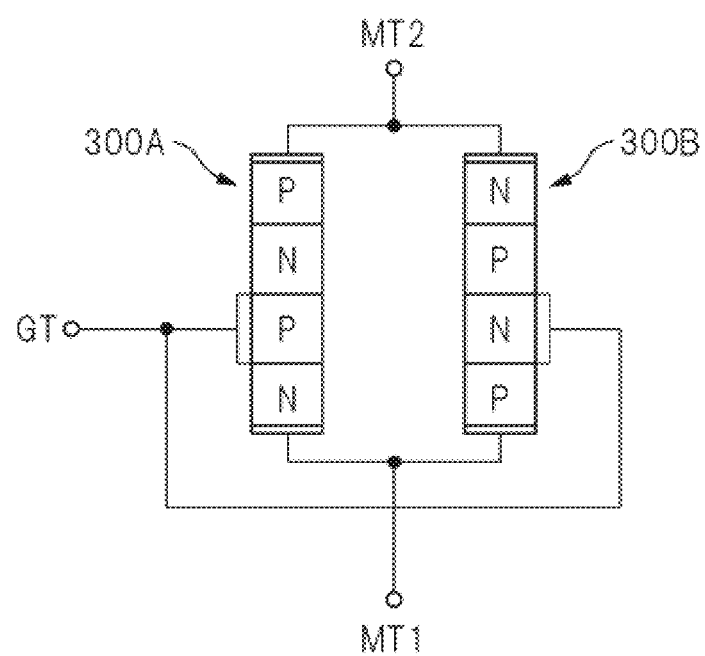
FIG. 19 is a diagram schematically showing a structure of the bidirectional thyristor.

FIG. 18 is a circuit diagram of a bidirectional thyristor. Further, FIG. 19 is a diagram schematically showing a structure of the bidirectional thyristor.

A bidirectional thyristor is a type of power semiconductor device, a semiconductor device capable of controlling the bidirectional current with one gate electrode. In principle, the bidirectional thyristor is configured to control the bidirectional current by connecting the thyristor 300 A (i.e. 300 ampere) and the thyristor 300B that can control the current in one direction in anti-parallel, as shown in FIGS. 18 and 19. The bidirectional thyristor is widely used for the control of AC power supply, because they allow current to flow in both directions. The bidirectional thyristor, as shown in FIGS. 18 and 19, has three terminals of the main terminal MT1 and the main terminal MT2 and the gate terminal GT, by giving a control signal to the gate terminal GT, the main terminal MT1 not only can flow a current to the main terminal MT2, it is also possible to flow a current from the main terminal MT2 to the main terminal. The main terminal MT1 is also referred to as a first anode terminal, the main terminal MT2 is also referred to as a second anode terminal.

Figure 20:
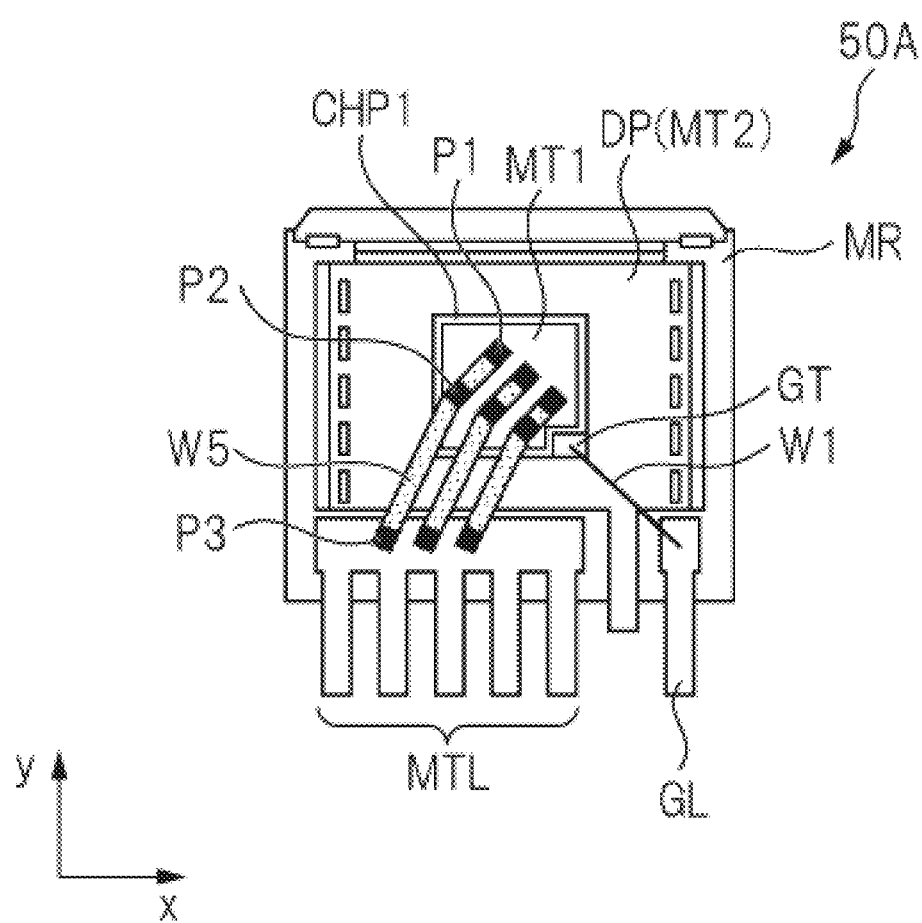
FIG. 20 is a diagram showing a configuration of a semiconductor device including the bidirectional thyristor.

FIG. 20 is a diagram showing a configuration of a semiconductor device 50A including the bidirectional thyristor so far. As shown in FIG. 20, a semiconductor chip CHP1 in which a bidirectional thyristor is formed is mounted on the die pad DP serving as a main terminal MT2. Then, on the surface of the semiconductor chip CHP1, the main terminal MT1 and the gate terminal GT is formed. Further, the lead MTL for the gate terminal lead GL and the main terminal along one side of the sealing body MR is disposed. Here, while the gate terminal GT and the gate terminal lead GL is electrically connected by a wire W1, the main terminal MT1 and the main terminal lead MTL is electrically connected by a wire W5. Here, as shown in FIG. 20, each of the plurality of wires W5 is bonded at a plurality of locations and the main terminal MT1. For example, the wire W5 and the main terminal MT1 are connected at the junction P1 and junction P2. That is, the number of junctions between the wire W5 and the main terminal MT1 is two. On the other hand, each wire W5 and the main terminal lead MTL is connected at the junction P3. That is, the number of junctions between each wire W5 and the main terminal lead MTL is one. In this way, semiconductor device 50A is configured.

Figure 21:
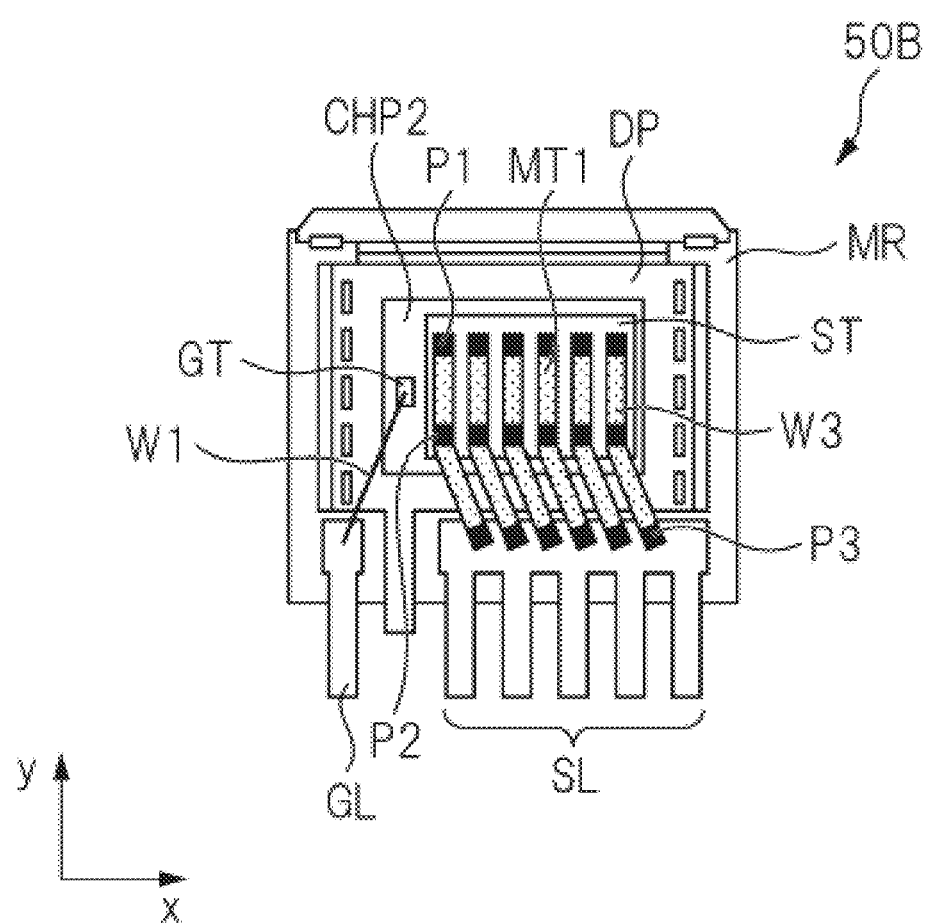
FIG. 21 is a diagram showing a configuration of a semiconductor device including the power MOSFET.

In contrast, FIG. 21 is a diagram showing a configuration of a semiconductor device 50B including the power MOSFET so far. As shown in FIG. 21, a semiconductor chip CHP2 in which a power MOSFET is formed is mounted on the die pad DP serving as a drain. Then, on the surface of the semiconductor chip CHP2, the source terminal ST and the gate terminal GT is formed. Further, the lead SL for the gate terminal lead GL and the source terminal along one side of the sealant MR is disposed. Here, while the gate terminal GT and the gate terminal lead GL is electrically connected by a wire W1, the source terminal ST and the source terminal lead SL is electrically connected by a wire W3. Here, as shown in FIG. 21, each of the plurality of wires W3 is bonded at a plurality of locations and the source terminal ST. For example, the respective wires W3 and the source terminal ST1 are connected at the junction P1 and junction P2. That is, the number of junctions between the respective wires W3 and the source terminal ST1 is two. On the other hand, each wire W3 and the source terminal lead SL is connected at the junction P3. That is, the number of bonding points between each wire W3 and the source terminal lead SL is one. In this way, semiconductor device 50B is configured.

As can be seen by looking at FIGS. 20 and 21, the arrangement position of the gate terminal GT of the semiconductor chip CHP1 bidirectional thyristor is formed, the arrangement position of the gate terminal GT of the semiconductor chip CHP2 power MOSFET is formed is reversed. Consequently, the arrangement of the lead GL for the gate terminal and the lead MTL for the main terminal in semiconductor device 50A, the arrangement of the lead GL for the gate terminal and the lead SL for the source terminal in semiconductor device 50B differs. Therefore, it can be seen that it is difficult for the current semiconductor device 50A and semiconductor device 50B to share the layout of several leads. In this regard, applying the contrivance of the layout of multiple leads in the present embodiment allows a common layout of multiple leads in a semiconductor device 50B that includes a semiconductor device 50A and powered MOSFET that includes a bidirectional thyristor. This point will be described below.

First, in FIG. 6, with respect to semiconductor device in which the power MOSFET is formed, semiconductor device 10 is shown in which the arrangement layout of the plurality of leads in the present embodiment is applied.

Figure 22:
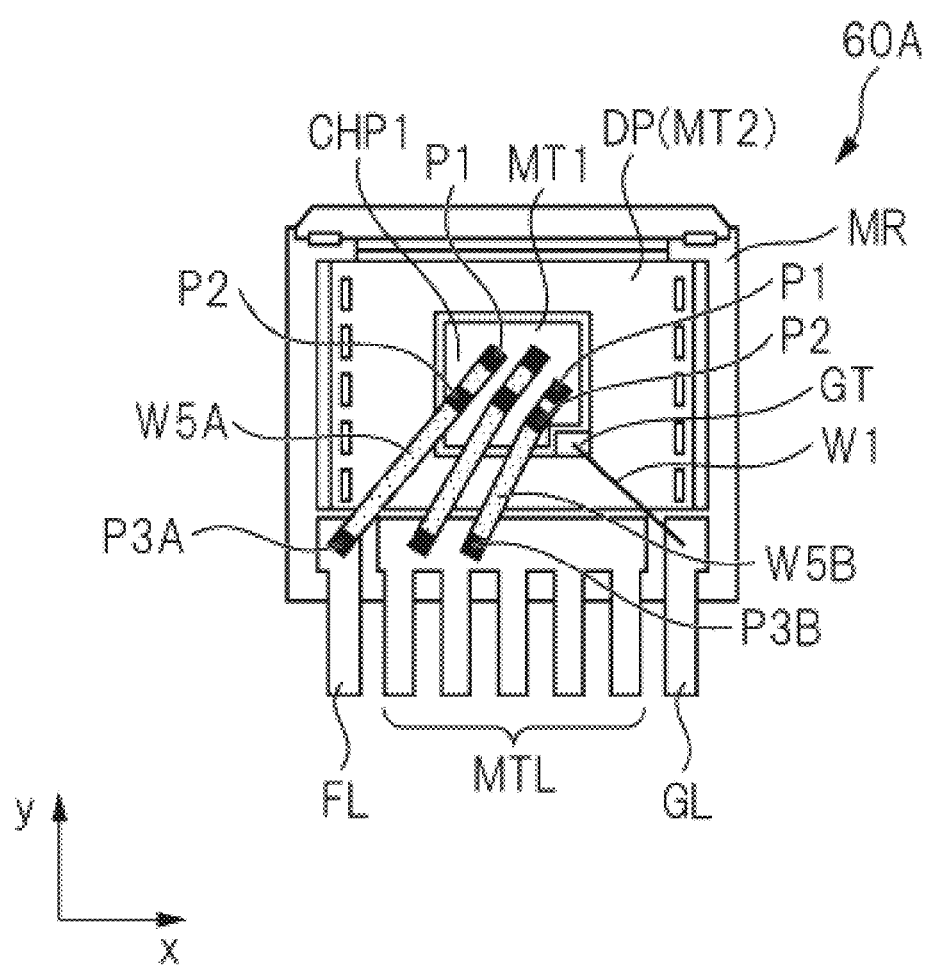
FIG. 22 is a diagram showing an example of a semiconductor device in which an arrangement layout of a plurality of leads according to an embodiment is applied, with regard to the semiconductor device in which the bidirectional thyristor is formed.

On the other hand, with regard to the semiconductor device in which the bidirectional thyristor is formed, a semiconductor device 60A in which an arrangement layout of a plurality of leads according to the present embodiment is applied is shown in FIG. 22.

As can be seen by comparing both FIGS. 6 and 22, by applying the arrangement layout of the plurality of leads in the present embodiment, it can be seen that both semiconductor device 10 including the powered MOSFET and semiconductor device 60A including the bidirectional thyristor are feasible.

In particular, the multi-function terminal lead FL shown in FIG. 22 is configured to be electrically connected to the main terminal MT1 via the wire W5A in semiconductor device 60A including the bidirectional thyristor. On the other hand, the multi-function terminal lead FL, in semiconductor device 10 including a power MOSFET, functions as a lead KL for Kelvin terminal connected to the Kelvin terminal KT via the wire W2. This realizes both semiconductor device 10 including the powered MOSFET and semiconductor device 60A including the bidirectional thyristor by applying the arrangement layout of the plural leads in the present embodiment. In other words, according to the present embodiment, in both semiconductor device 10 including the power MOSFET and semiconductor device 60A including the bidirectional thyristor, it can be seen that the use of the multi-function terminal lead FLs successfully enables the sharing of the arrangement layout of the plurality of leads. Therefore, the technical philosophy of the present embodiment can be said to be versatile in that the layout of multiple leads can be standardized in semiconductor device with different functions.

Incidentally, as shown in FIG. 22, the wire W5A is joined at a plurality of locations and the main terminal MT1. For example, the wire W5A and the main terminal MT1 are connected at the junction P1 and junction P2. That is, the number of junctions between the wire W5A and the main terminal MT1 is two. On the other hand, the wire W5A and the multi-function terminal lead FL is connected at the junction P3A. That is, the number of junctions between the wire W5A and the multifunction terminal lead FL is one.

Further, as shown in FIG. 22, the wire W5B is joined at a plurality of locations and the main terminal MT1. For example, the wire W5B and the main terminal MT1 is connected at the junction P1 and junction P2. That is, the number of junctions between the wire W5B and the main terminal MT1 is two. On the other hand, the wire W5B and the main terminal lead MTL are connected at the junction P3B. That is, the number of junctions between the wire W5B and the main terminal lead MTL is one.

Figure 23:
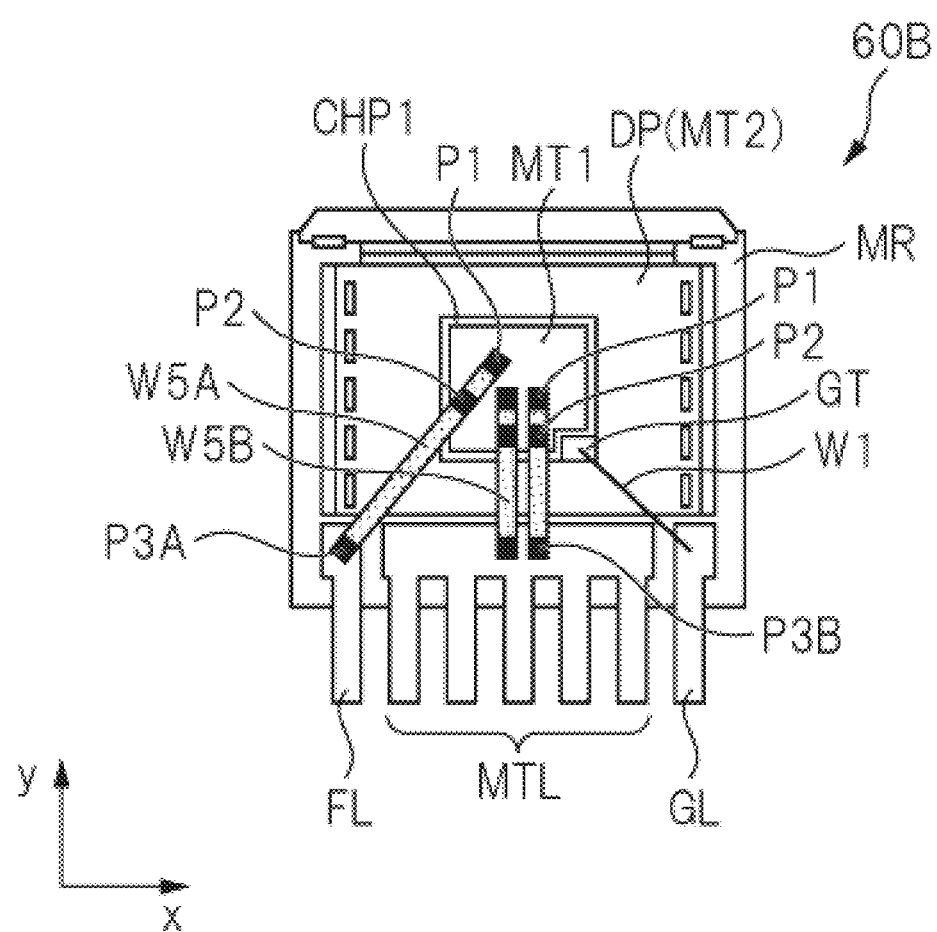
FIG. 23 is a diagram showing another example of the semiconductor device in which the arrangement layout of the plurality of leads according to the embodiment is applied, with regard to the semiconductor device in which the bidirectional thyristor is formed.

Incidentally, in FIG. 22, with respect to semiconductor device in which the bidirectional thyristor is formed, a semiconductor device 60A is shown in which the arrangement layout of a plurality of leads according to the present embodiment is applied, but the present invention is not limited thereto, for example, it may be configured as a semiconductor device 60B shown in FIG. 23. In this case, since the wire W5B included in semiconductor device 60B does not have a bending portion, it is considered that it is possible to reduce the on-resistance than semiconductor device 60A.

The invention made by the present inventor has been described above in detail based on the embodiment, but the present invention is not limited to the embodiment described above, and it is needless to say that various modifications can be made without departing from the gist thereof.

What is claimed is:

1. A semiconductor device comprising:
    a die pad;
    a semiconductor chip mounted on the die pad;
    a plurality of leads arranged along a first side of the semiconductor chip in plan view; and
    a plurality of connecting members electrically connecting the semiconductor chip with the plurality of leads,
    wherein the semiconductor chip includes:
        a gate terminal;
        a sense terminal; and
        a force terminal including a portion located between the gate terminal and the sense terminal, and
    wherein the plurality of leads includes:
        a gate terminal lead electrically connected with the gate terminal via a gate terminal connecting member of the plurality of connecting members;
        a sense terminal lead electrically connected with the sense terminal via a sense terminal connecting member of the plurality of connecting members; and
        a force terminal lead located between the gate terminal lead and the sense terminal lead in plan view and electrically connected with the force terminal via a force terminal connecting member of the plurality of connecting members.

2. The semiconductor device according to claim 1, wherein the force terminal connecting member is formed in a linear shape extending in a second direction perpendicular to a first direction in which the first side is extended.

3. The semiconductor device according to claim 1, wherein, in plan view, the force terminal connecting member is formed in a linear shape such that a longitudinal axis of the force terminal connecting member extends-extending only in a second direction perpendicular to a first direction in which the first side is extended.

4. The semiconductor device according to claim 3, wherein the force terminal connecting member is a wire comprised of one of gold and copper.

5. The semiconductor device according to claim 4,
    wherein a number of a bonding point between the gate terminal connecting member and the gate terminal is one,
    wherein a number of a bonding point between the sense terminal connecting member and the sense terminal is one, and
    wherein a number of a bonding point between the force terminal connecting member and the force terminal is two or more.

6. The semiconductor device according to claim 5, wherein a number of the force terminal connecting member is larger than a number of each of the gate terminal connecting member and the sense terminal connecting member.

7. The semiconductor device according to claim 6, wherein the semiconductor device is configured to be capable of flowing a current of 300 A.

8. The semiconductor device according to claim 1, wherein the force terminal connecting member is a ribbon comprised of aluminum.

9. The semiconductor device according to claim 8,
    wherein a number of a bonding point between the gate terminal connecting member and the gate terminal is one,
    wherein a number of a bonding point between the sense terminal connecting member and the sense terminal is one, and
    wherein a number of a bonding point between the force terminal connecting member and the force terminal is two or more.

10. The semiconductor device according to claim 9, wherein the semiconductor device is configured to be capable of flowing a current of 300 A.

11. The semiconductor device according to claim 1, wherein the force terminal connecting member is a clip comprised of copper.

12. The semiconductor device according to claim 11,
    wherein a number of a bonding point between the gate terminal connecting member and the gate terminal is one,
    wherein a number of a bonding point between the sense terminal connecting member and the sense terminal is one, and
    wherein a number of a bonding point between the force terminal connecting member and the force terminal is one.

13. The semiconductor device according to claim 12, wherein the semiconductor device is configured to be capable of flowing a current of 300 A.

14. The semiconductor device according to claim 1,
    wherein a power MOSFET is formed in the semiconductor chip,
    wherein the sense terminal is a Kelvin terminal, and
    wherein the force terminal is a source terminal.

15. The semiconductor device according to claim 14,
    wherein the semiconductor chip has:
        a main surface; and
        a back surface opposite the main surface, wherein the gate terminal electrically connected with a gate electrode of the power MOSFET is formed on the main surface,
wherein the sense terminal electrically connected with a source region of the power MOSFET is formed on the main surface,
wherein the force terminal electrically connected with the source region of the power MOSFET is formed on the main surface, and
wherein a drain electrode of the power MOSFET is formed on the back surface.

16. The semiconductor device according to claim 1, wherein the plurality of leads is arranged only beside the first side.

17. A semiconductor device comprising:
a die pad;
a semiconductor chip mounted on the die pad;
a plurality of leads arranged along a first side of the semiconductor chip in plan view; and
a plurality of connecting members electrically connecting the semiconductor chip with the plurality of leads,
wherein the semiconductor chip includes:
  a gate terminal;
  a multi-function terminal that can be used for multiple functions; and
  a force terminal including a portion located between the gate terminal and the multi-function terminal,
wherein the plurality of leads includes:
  a gate terminal lead electrically connected with the gate terminal via a gate terminal connecting member of the plurality of connecting members;
  a multi-function terminal lead electrically connected with the multi-function terminal via a multi-function terminal connecting member of the plurality of connecting members; and
  a force terminal lead located between the gate terminal lead and the multi-function terminal lead in plan view and electrically connected with the force terminal via a force terminal connecting member of the plurality of connecting members,
wherein when a power MOSFET is formed in the semiconductor chip, the multi-function terminal is a Kelvin terminal, and
wherein when a bidirectional thyristor is formed in the semiconductor chip, the multi-function terminal is the force terminal, and the multi-function terminal lead is another lead having a same function as the force terminal lead.

18. The semiconductor device according to claim 17, wherein the force terminal connecting member is formed in a linear shape extending in a second direction perpendicular to a first direction in which the first side is extended.

19. The semiconductor device according to claim 17, wherein, in plan view, the force terminal connecting member is formed in a linear shape such that a longitudinal axis of the force terminal connecting member extends in a second direction perpendicular to a first direction in which the first side is extended.

20. The semiconductor device according to claim 19, wherein the semiconductor device is configured to be capable of flowing a current of 300 A.

* * * * *